United States Patent
Knotts

[11] Patent Number: 5,983,377
[45] Date of Patent: Nov. 9, 1999

[54] SYSTEM AND CIRCUIT FOR ASIC PIN FAULT TESTING

[75] Inventor: Brian W. Knotts, West Columbia, S.C.

[73] Assignee: NCR Corporation, Dayton, Ohio

[21] Appl. No.: 08/972,352

[22] Filed: Nov. 17, 1997

[51] Int. Cl.⁶ .................................................. G01R 31/28
[52] U.S. Cl. ........................................... 714/726; 714/724
[58] Field of Search .................................... 714/724, 726, 714/727, 729, 730, 731, 733, 734; 324/158.1; 365/201, 189.02, 189.05

[56] References Cited

U.S. PATENT DOCUMENTS

| | | | |
|---|---|---|---|
| 4,791,359 | 12/1988 | Raymond et al. | 324/73 R |
| 5,383,195 | 1/1995 | Spence et al. | 714/733 |
| 5,406,216 | 4/1995 | Millman et al. | 714/733 X |
| 5,425,034 | 6/1995 | Ozaki | 714/726 |
| 5,434,804 | 7/1995 | Bock et al. | 364/579 |
| 5,450,415 | 9/1995 | Kamada | 371/22.3 |
| 5,477,545 | 12/1995 | Huang | 714/726 |
| 5,504,432 | 4/1996 | Chandler | 324/537 |
| 5,513,186 | 4/1996 | Levitt | 714/726 |
| 5,546,406 | 8/1996 | Gillenwter et al. | 371/22.5 |
| 5,596,585 | 1/1997 | Njinda et al. | 371/22.5 |
| 5,907,562 | 5/1999 | Wrape et al. | 714/727 |

*Primary Examiner*—Hoa T. Nguyen
*Attorney, Agent, or Firm*—Paul J. Maginot

[57] ABSTRACT

A system and circuit for pin fault testing is disclosed. The system includes an external tester and a circuit designed to be tested. The external tester is coupled to pins of the circuit and is configured to enter test data into the circuit. The external tester is also configured to receive continuity data from the circuit and to determine pin faults from a comparison of the test data to the continuity data. The circuit includes a plurality scan cells which are coupled in a chain fashion. When testing input pins, the external tester places a test pattern onto the input pins, stores a continuity pattern into the scan cells that are electro-mechanically coupled to the input pins, serially scans the continuity pattern out of the circuit, and compares the continuity pattern to the test pattern. When testing the output pins, the external tester serially scans a test pattern into the scan cells coupled to the output pins and compares the continuity pattern generated on the output pins to the test pattern.

18 Claims, 11 Drawing Sheets

SYSTEM AND CIRCUIT FOR ASIC PIN FAULT TESTING

BACKGROUND OF THE INVENTION

The present invention relates generally to application specific integrated circuits (ASIC's), and more particularly to a system and apparatus for ASIC pin fault testing.

In an application specific integrated circuit (ASIC), one general problem encountered in the manufacturing testing process is that the electro-mechanical connections used to get signals into and out of the ASIC logic from external devices may be defective. Consequently, test circuitry is typically built into an ASIC to verify continuity of input and output pins to the ASIC logic (i.e. detecting ASIC pin faults).

As illustrated in FIG. 1, ASIC 100 includes test circuitry for detecting ASIC pin faults. The test circuitry includes a boundary scan register 103, test logic 120, a test data in signal pin (TDI) 130, test data out signal pin (TDO) 132, test mode select signal pin (TMS) 134, and test clock pin (TCK) 136. The boundary scan register 103 includes input boundary scan cells (BSCs) 104A–104D and output boundary scan cells 105A–105D. The input boundary scan cells 104A–104D are placed between the ASIC logic 110 and all the ASIC data input pins 101A–101D and the output boundary scan cells 105A–105D are placed between the ASIC logic 110 and all the ASIC data output pins 102–102D. Here, "data input pins" refers to the pins that provide input signals to the ASIC logic 110 and "data output pins" refers to the pins that receive output signals from the ASIC logic 110.

Test logic 120 includes a test access port (TAP) 122, various registers 124, 126, 128, and control logic 129. The test logic 120 drives control lines for the boundary scan cells 104–104D and 105–105D and typically conforms to IEEE 1149.1 standard for boundary scan. The IEEE 1149.1 standard for boundary scan enables testing of the ASIC 100 for a variety of manufacturing tests beyond just simple ASIC pin fault testing.

A typical structure for an input boundary scan register cell (BSC) 203A and a typical structure for an output boundary scan register cell 203B are illustrated in FIGS. 2A and 2B, respectively. Input boundary scan cells 104A–104D are identical and are represented by cell 203A (FIG. 2). Output boundary scan register cells 105A–105D are also identical and are represented by cell 203B (FIG. 3). Moreover, the basic structure of cells 203A and 203B is the same. The only difference in cells 203A and 203B is the source of the input signal for the cell and the use of the output signal from the cell.

Each cell 203A, 203B includes two two-to-one multiplexers 211A, 214A and 211B, 214B and two D-type flip-flops 212A, 213A and 212B, 213B. Test logic 120 drives five control lines which are used by cells 203A, 203B. If the signal on control line MODE is active, the input signal to cell 203A, 203B is not simply passed through the cell. Rather, multiplexer 214A, 214B passes the signal generated by D-type flip-flops 212A, 213A and 212B, 213B to the cell output line.

In normal operation of ASIC 100, cells 203A and 203B add two two-to-one multiplexers signal propagation time delays between the input and output pins of ASIC 100. This time delay is in addition to the time delay of ASIC logic 110. In addition to the time delay, cells 203A and 203B increase the gate count of ASIC 100. The size of a logic section in ASIC 100 is measured by the number of "equivalent gates" required to build the logic section. Herein, the number of equivalent gates is the number of the two input NAND gates required to duplicate the function of the logic section. Using an equivalent gate count, different designs can be compared on an equal basis. Table 1 gives the equivalent gate count for one BSC, either an input BSC 203A or an output BSC 203B.

TABLE 1

| Gate Type | # Equivalent Gates | # in Cell | Total # Equivalent Gates |
|---|---|---|---|
| 2 Input Mux | 3 | 2 | 6 |
| D Flip-Flop | 8 | 2 | 16 |
| | Total Equivalent Gates in Cell | | 22 |

Thus, in view of Table 1, the boundary scan register cells require an additional 44 equivalent gates for each input pin-output pin pair, or in general: Additional BSC Gate Count=(# Input Pins)*22+(# Output Pins)*22.

The physical size and cost of ASIC 100 is proportional to the number of gates in ASIC 100. Thus, adding test circuitry directly increases the physical size and component cost of ASIC 100. Furthermore, any test circuitry placed in series with ASIC logic 110 between an input pin and an output pin adds signal propagation delay time as the signals are routed through the additional test circuitry. This additional signal propagation delay occurs even when the ASIC is not being tested, thus impairing the normal operation of the ASIC 100.

Therefore, boundary scan adds both excessive logic gates to ASIC 100 and excessive propagation delay for signals as the signals travel through the additional test circuitry. Both of these effects are detrimental to the ASIC performance and cost. Unfortunately, as ASICs are used in higher speed systems, the time delay which the ASIC can tolerate and still operate properly diminishes. Only minimal additional time delays can be tolerated.

What is needed therefore is a method and apparatus which enables testing for ASIC pin faults while not substantially adding to the signal propagation delay time and physical size of the ASIC.

SUMMARY OF THE INVENTION

In accordance with one embodiment of the present invention, there is provided an integrated circuit that includes a logic core, a first multiplexer, and a first storage element. The integrated circuit further includes a scan enable pin for receiving a control signal, a scan-in pin for receiving scan data, a first input pin for receiving first data, and a scan-out pin for outputting the scan data.

The first multiplexer has a first mux input coupled to the scan-in pin, a second mux input directly coupled to the first input pin via a first bonding connection, a first mux select coupled to the scan enable pin, and a first mux output. Upon the first mux output, the first multiplexer places first cell data that is selected, based on the control signal, from (1) a first bit of the scan data upon the first mux input and (2) a first bit of continuity data upon the second mux input. The first bit of the continuity data is indicative of the first data if continuity exists between the first input pin and the second mux input.

The first storage element has a first storage input directly coupled to the first mux output, and a first storage output directly coupled to the first core input and further coupled to the scan-out pin. The first storage element is configured to latch the first cell data placed on the first mux output.

Pursuant to another embodiment of the present invention, there is provided a system for pin fault testing. The system includes an external tester and an integrated circuit to be tested. The external tester is coupled to pins of the integrated circuit and is configured to input test data into the integrated circuit. The external tester is also configured to receive continuity data from the integrated circuit and to determine pin faults from a comparison of the test data inputted into the integrated circuit to the continuity data received from the integrated circuit.

The integrated circuit includes a logic core, a first multiplexer, and a first storage element. The integrated circuit further includes a scan enable pin for receiving a control signal, a scan-in pin for receiving scan data, a first input pin for receiving first data, and a scan-out pin for outputting the scan data. The first mulitplexer has a first mux input coupled to the scan-in pin, a second mux input directly coupled to the first input pin via a first bonding connection, a first mux select coupled to the scan enable pin, and a first mux output. Upon the first mux output, the first multiplexer places first cell data that is selected, based upon said control signal, from (1) a first bit of the scan data upon the first mux input and (2) a first bit of continuity data upon the second mux input. The first bit of the continuity data is indicative of the first data if continuity exists between the first input pin and the second mux input. The first storage element has a first storage input directly coupled to the first mux output, and a first storage output directly coupled to the first core input and further coupled to the scan-out pin. The first storage element is configured to latch the first cell data placed on the first mux output.

Pursuant to yet another embodiment of the present invention, there is provided another integrated circuit. The integrated circuit includes (1) a logic core having a first core input; (2) a scan enable pin for receiving a control signal; (3) a scan-in pin for receiving scan data; (4) a first input pin for receiving first data; (5) a scan-out pin for outputting the scan data; and (f) a first scan cell. The first scan cell has a first data input directly coupled to the first input pin via a first bonding connection, a first data output directly coupled to the first core input, a first scan input coupled to the scan-in pin, a first scan output coupled to the scan-out pin, and a first scan enable coupled to the scan enable pin.

Furthermore, the first scan cell includes a first mulitplexer and a first storage element. The first mulitplexer has a first mux input coupled to the first scan input, a second mux input directly coupled to the first data input, a first mux select coupled to the first scan enable, and a first mux output. Upon the first mux output, the first multiplexer places first cell data that is selected, based on said control signal, from (1) a first bit of the scan data upon the first mux input and (2) a first bit of continuity data upon the second mux input. The first bit of the continuity data is indicative of the first data if continuity exists between the first input pin and the second mux input. The first storage element has a first storage input directly coupled to the first mux output, and a first storage output directly coupled to the first data output and further coupled to the scan output. The first storage element is configured to latch the first cell data placed on the first mux output.

It is an object of the present invention to provide an improved circuit design.

It is an object of the present invention to provide a new and useful system of testing for circuit pin faults.

It is also an object of the present invention to provide a new and useful circuit design that enables pin fault testing.

It is yet another object of the present invention to provide a system and circuit design that enables pin fault testing without adding additional signal propagation delay.

It is yet another object of the present invention to provide a system and circuit design that enables pin fault testing without adding significant cost to the circuit.

It is yet a further object of the present invention to provide a system and circuit design that enable pin fault testing without adding significantly adding to the physical size of the circuit.

The above and other objects, features, and advantages of the present invention will become apparent from the following description and the attached drawings.

DETAILED DESCRIPTION OF PREFERRED EMBODIMENTS

Figure 1:
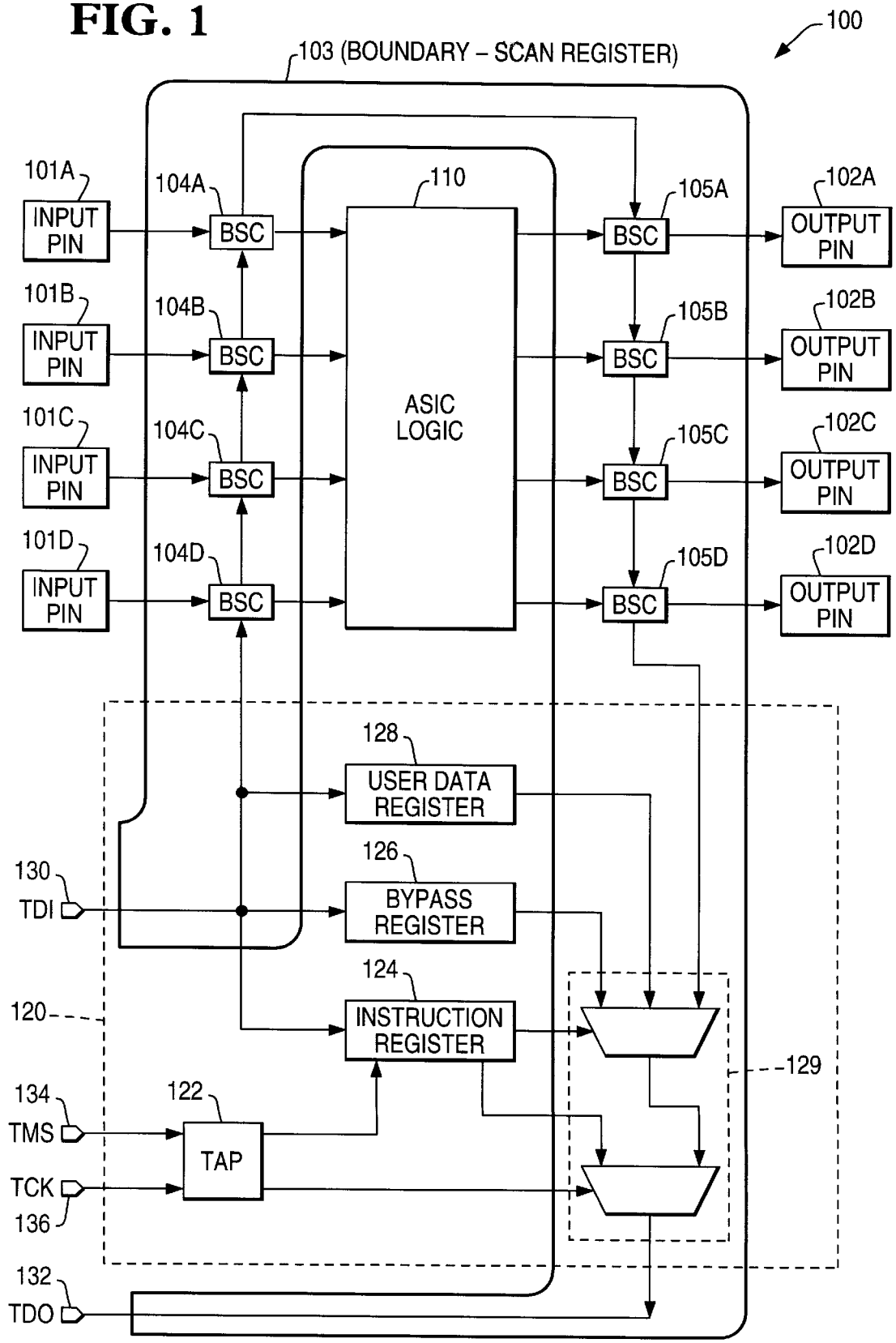
FIG. 1 shows a block diagram of a prior art ASIC with input boundary scan cells, output boundary scan cells, and test logic for testing of the ASIC.
Figure 2A:
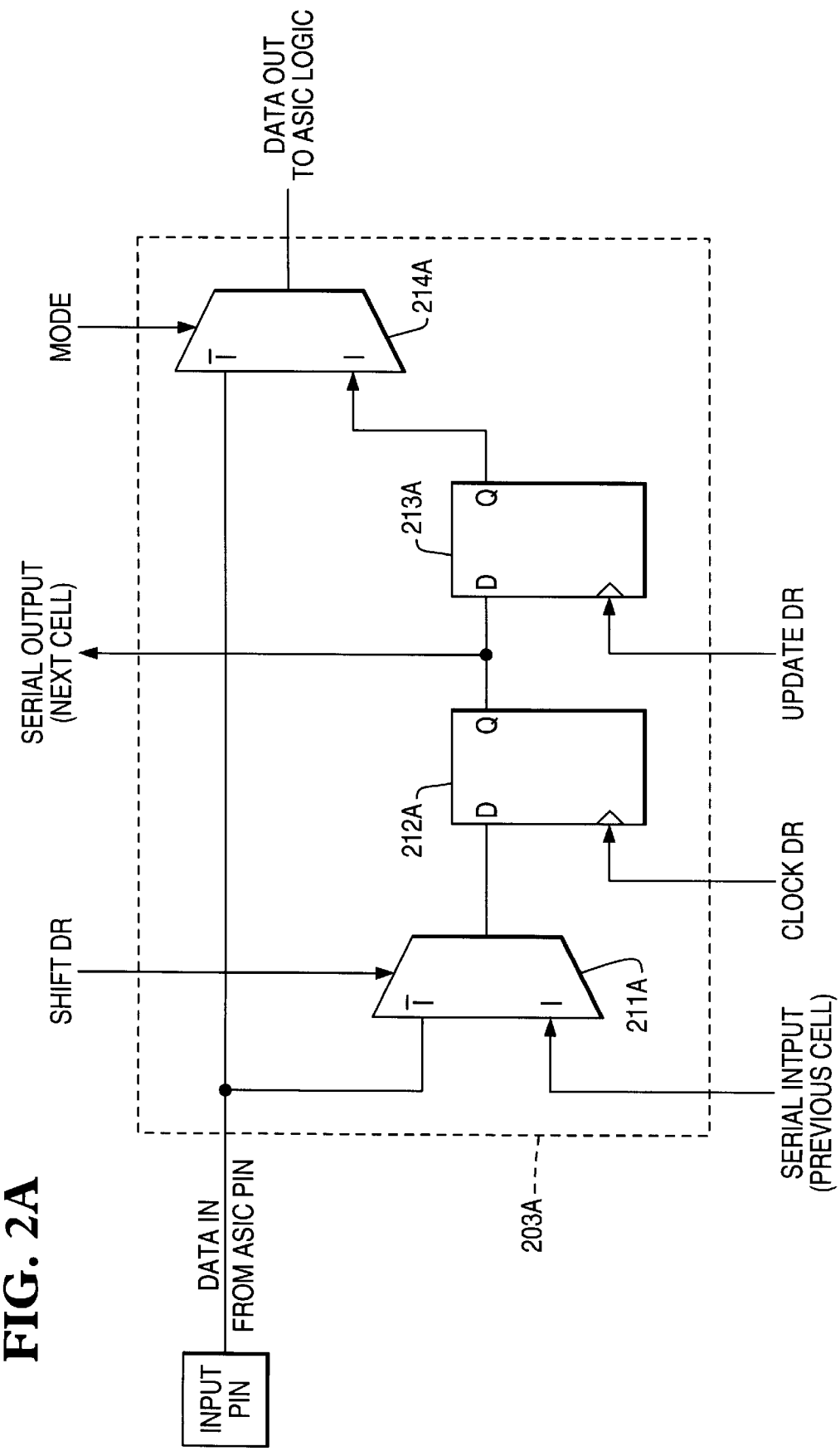
FIG. 2A shows a schematic diagram of a prior art input boundary scan register cell.
Figure 2B:
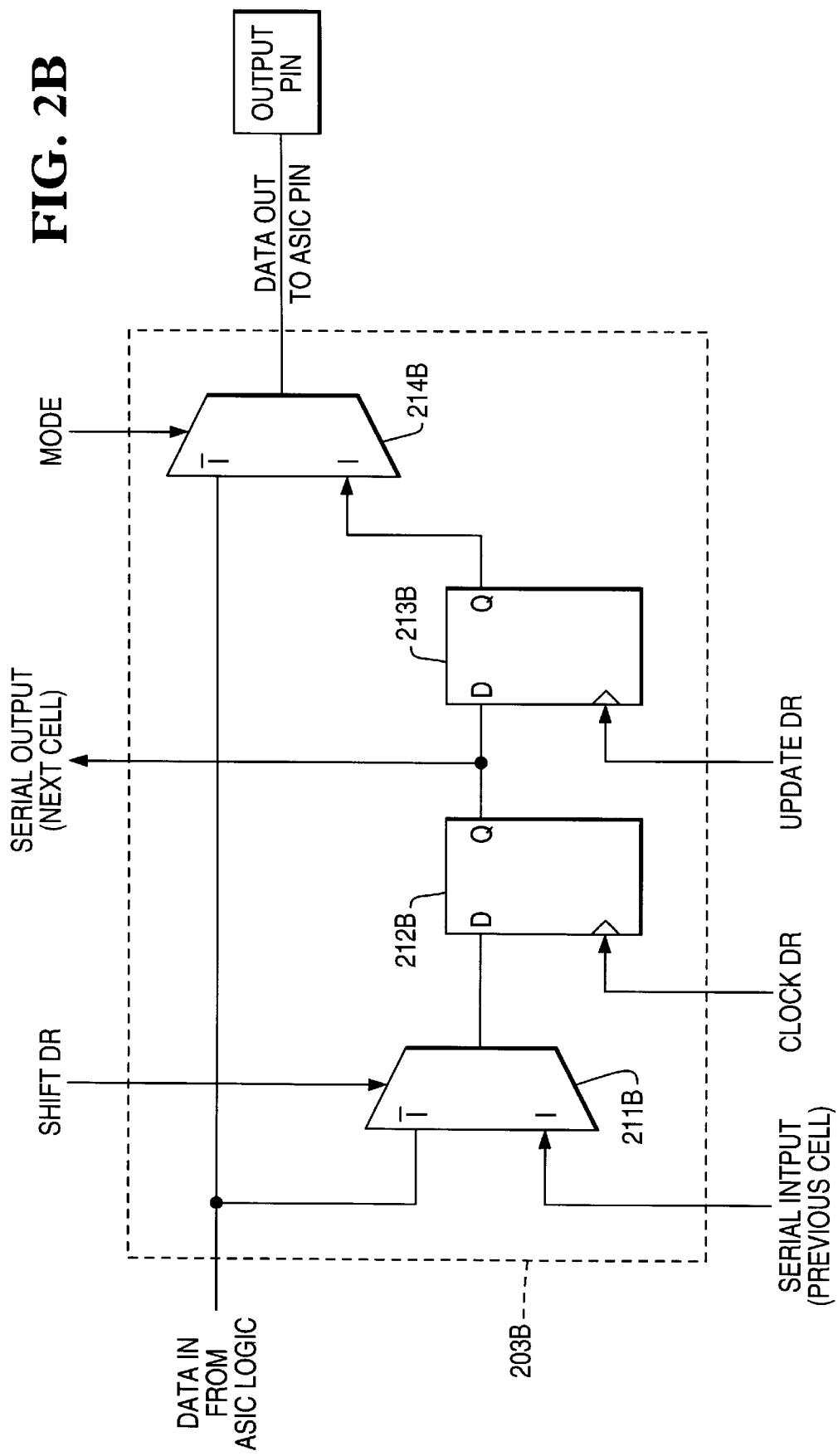
FIG. 2B shows a schematic diagram of a prior art output boundary scan register cell.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 3:
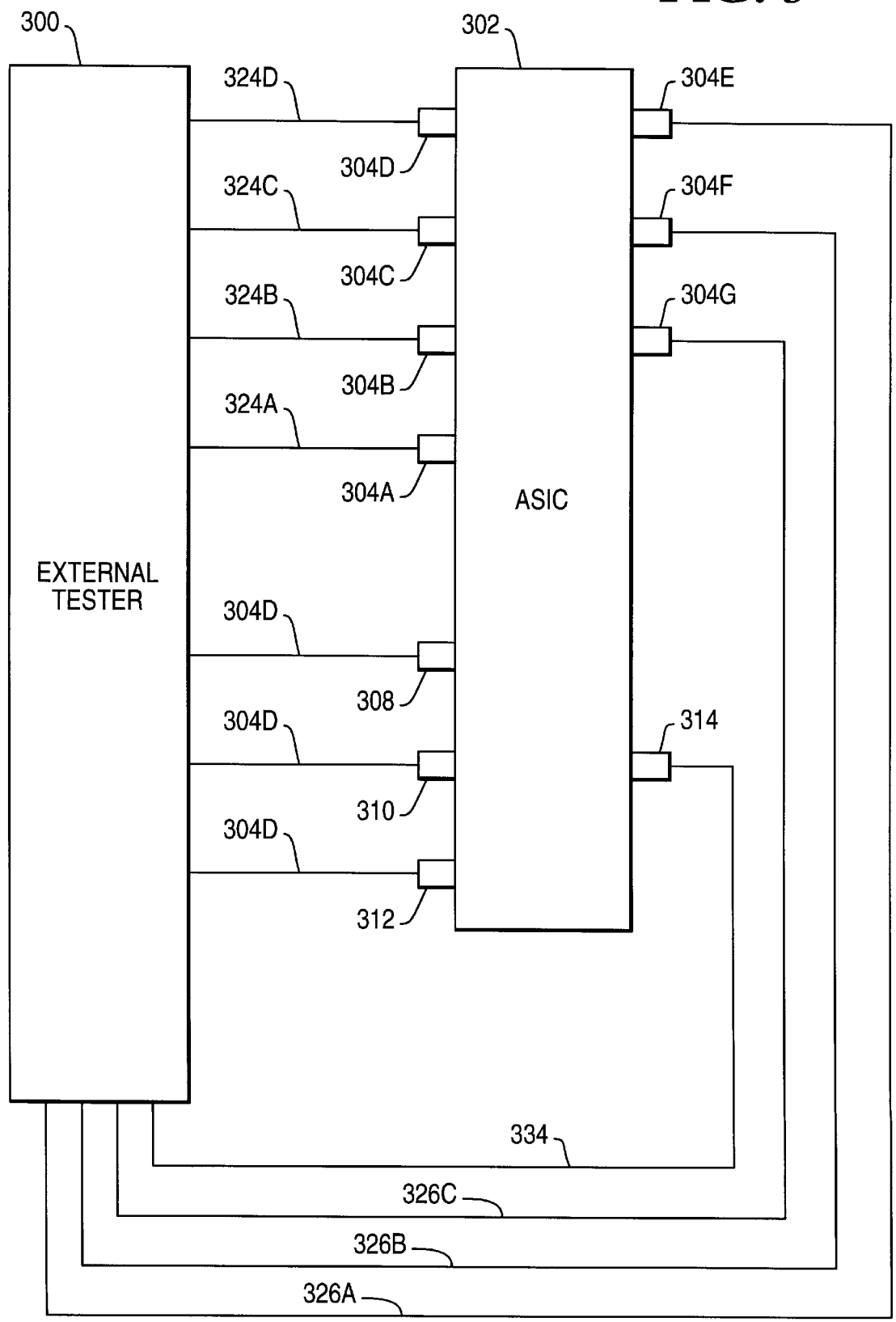
FIG. 3 shows an external tester coupled to an ASIC in a manner to utilize features of the present invention.

Referring now to FIG. 3, there is shown a block diagram of an external tester 300 and application specific integrated circuit (ASIC) 302 which incorporate features of the present invention therein. The external tester 300 tests the ASIC 302 for ASIC pin faults and may further test the functional operation of the ASIC 300. The external tester 300 generally tests for ASIC pin faults by controlling the operation of the ASIC 300, placing test patterns upon the I/O pins of the ASIC 300, and later comparing these test patterns with continuity data of the ASIC 302 (see discussion of FIGS. 8 and 9). What is meant herein by the term "external tester" is a testing device (e.g. a computer system with a proper interface) that is external to the ASIC 300. In other words, the external tester 300 is not part of nor resides in the ASIC 302.

The ASIC 302 includes I/O pins 304A–304G, a scan-in pin 308, a scan enable pin 310, an ASIC clock pin 312, and a scan-out pin 314. The input pins 304A–304D are coupled to the external tester 300 via input lines 324A–324D, and the output pins 304E–304G are coupled to the external tester 300 via output lines 326A–326D. Furthermore, the scan-in pin 308, the scan enable pin 310, the ASIC clock pin 312, and the scan-out pin 314 are respectively coupled to the external tester 300 via a scan-in line 328, a scan enable line 330, an ASIC clock line 332, and a scan-out line 334.

Figure 4:
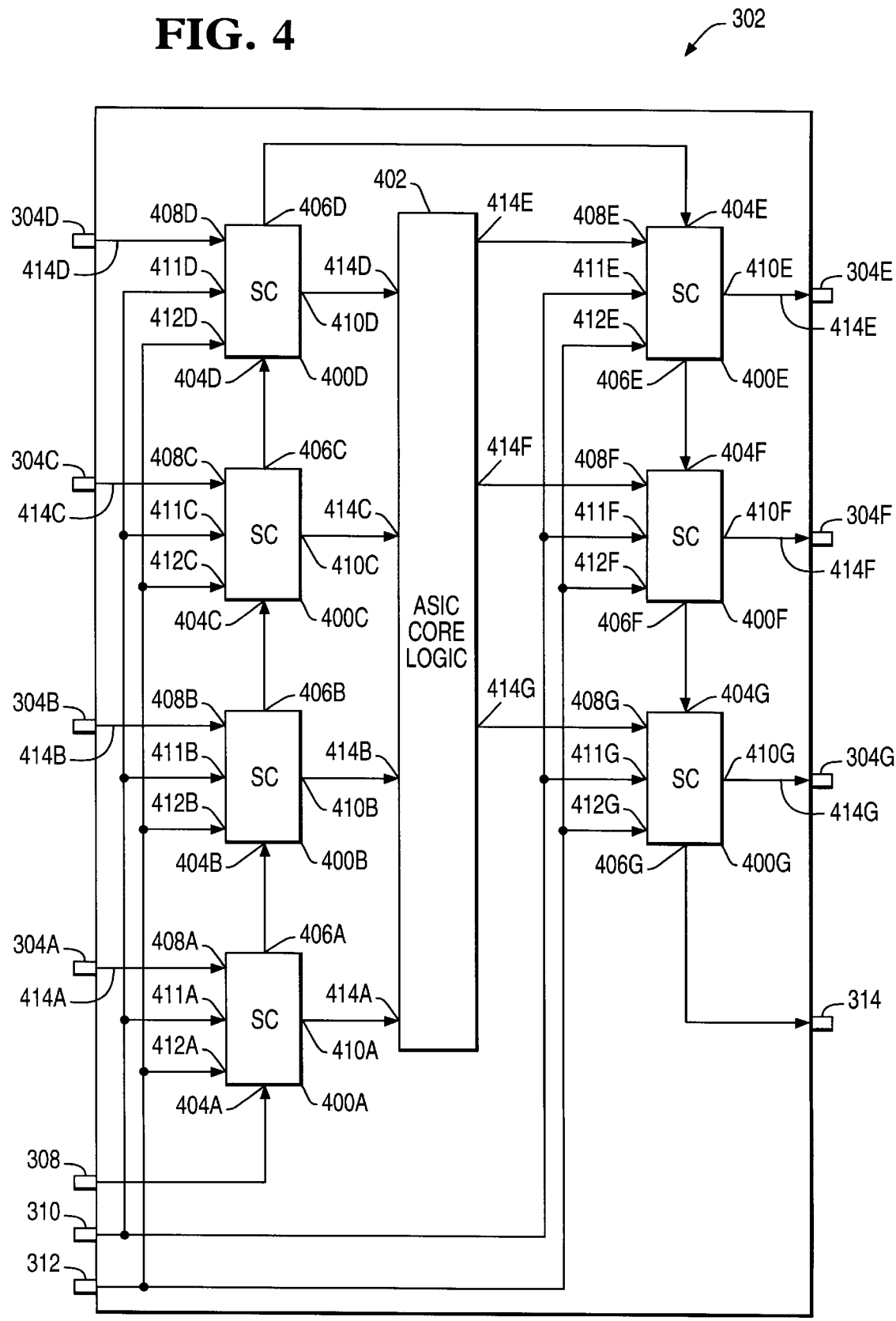
FIG. 4 shows the I/O scan structure of the ASIC of FIG. 3.

Referring now to FIG. 4, there is shown an I/O scan structure for ASIC 302 of FIG. 3. As shown in FIG. 4, ASIC 302 includes scan cells 400A–400G and ASIC core logic 402. Each scan cell 400A–400G scan cell 400A–400G includes a scan input 404A–404G, a scan output 406A–406G, a data input 408A–408G, a data output 410A–410G, a scan enable 411A–411G, and a clock input 412A–412G. Furthermore, the ASIC core logic 402 includes core inputs 414A–414D at which data enters the ASIC core logic 402 and core outputs 414E–414G from which data exits the ASIC core logic 402.

The scan cells 400A–400G form a chain of storage elements between the scan-in pin 308, and the scan-out pin 314. In particular, the scan input 404A is coupled to the scan-in pin 308, each scan input 404B–404G of the scan cell 400B–400G is coupled to the scan output 406A–406F of the previous scan cell 400A–400F, and the scan output 406G of scan cell 400G is coupled to the scan-out pin 314. Furthermore, each scan enable 411A–411G of the scan cells 400A–400G is coupled to the scan enable pin 310, and each clock input 412A–412G of the scan cells 400A–400G is coupled to the clock input pin 312.

Moreover, each data output 410A–410D of the input scan cell is directly coupled to a respective core input 414A–414D, and each data input 408E–408G of the output scan cells 400E–400G is directly coupled to a respective core output 414E–414G. Furthermore, each data input 408A–408D of input scan cells 400A–400D is supposed to be operatively and directly coupled to its respective input pin 304A–304D via bonding connections 414A–414D, and each data output 410E–410G of the output scan cells 400E–400G is supposed to be operatively and directly coupled to its respective output pin 304E–304G via bonding connections 414E–414G. Whether the bonding connections 414A–414G in fact operatively couple the I/O pins 304E–304G to their respective scan cells 400A–400G and therefore the ASIC core logic 402 is one objective of the present invention.

What is meant herein by two components being "directly coupled" to one another is that a signal path exists between the two components that does not include any logic components such as logic gates, storage elements, or multiplexers. Furthermore, what is meant herein by one component being "directly coupled" to another component "via a bonding connection" is that a signal path exists between the two components that includes a bonding connection such as a wire or other conductive material but does not include any logic components such as logic gates, storage elements, or multiplexers.

Figure 5A:
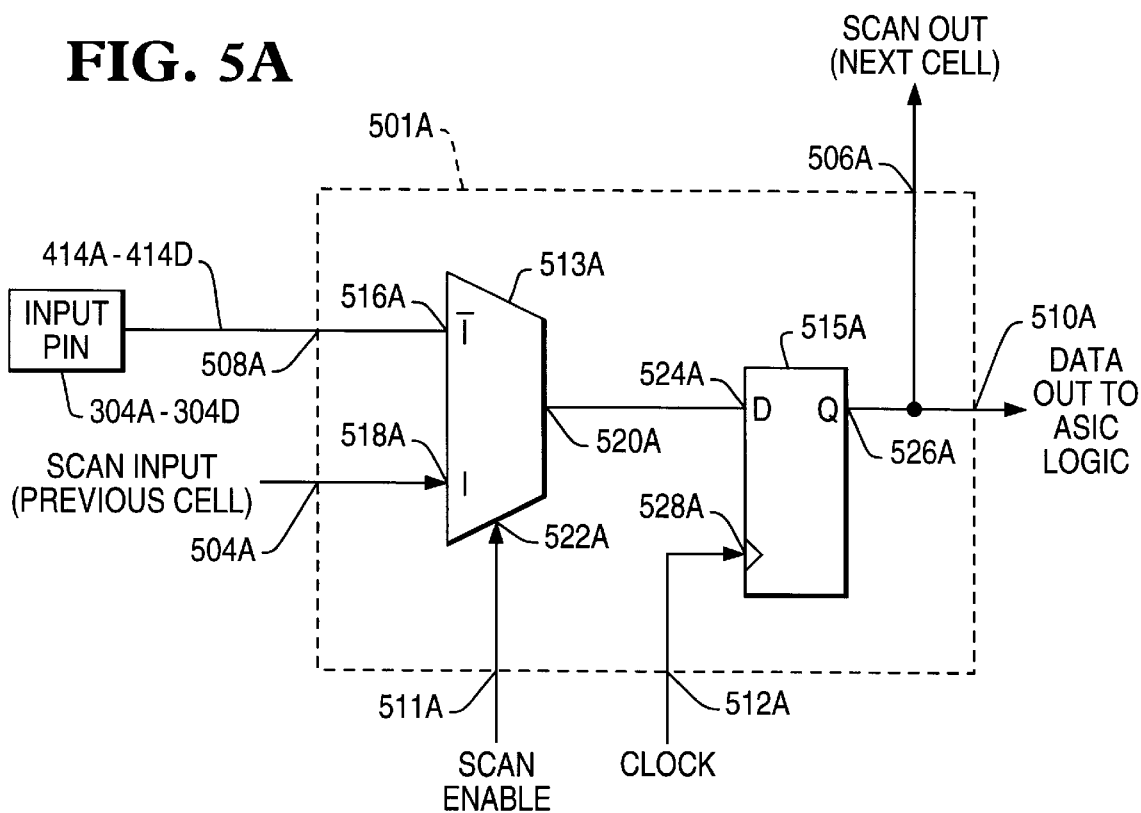
FIG. 5A shows a first embodiment for an input scan cell of FIG. 4.
Figure 5B:
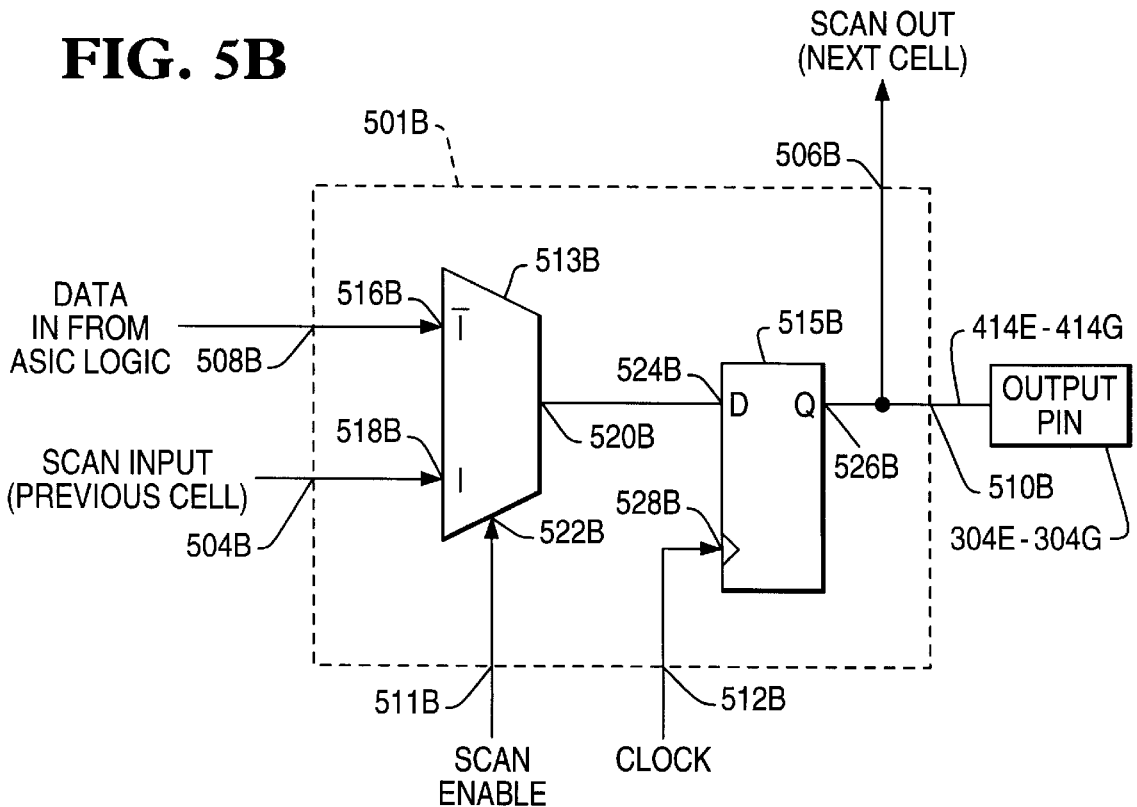
FIG. 5B shows a first embodiment for an output scan cell of FIG. 4.

A first scan embodiment 501A for the input scan cells 400A–400D and a first embodiment 501B for the output scan cells 400E–400G are illustrated in FIGS. 5A and 5B, respectively. The basic structure of the scan cells 501A, 501B is the same. The only difference between the scan cells 501A, 501B is the source of the input signal for the cell and the use of the output signal from the cell.

Each scan cell 501A, 501B includes a scan input 504A, 504B, a scan output 506A, 506B, a data input 508A, 508B, a data output 510A, 510B, a scan enable 511A, 511B, a clock input 512A, 512B, a two-to-one multiplexer 513A, 513B, and a D-type flip-flop 515A, 515B. The multiplexer 513A, 513B includes a first input 516A, 516B, a second input 518A, 518B, an output 520A, 520B, and a selector 522A, 522B. The D flip-flop 515A, 515B includes a D input 524A, 524B, a Q output 526A, 526B, and a positive edge triggered clock input 528A, 528B.

The data input 508A, 508B of the scan cell 501A, 501B is directly coupled to the first input 516A, 516B of the multiplexer 513A, 513B, and the scan input 504A, 504B of the scan cell 501A, 501B is coupled to the second input 518A, 518B of the multiplexer 513A, 513B. The output 520A, 520B of the multiplexer 513A, 513B is directly coupled to the D input 524A, 524B of the D flip-flop 515A, 515B, and the Q output 526A, 526B is directly coupled to both the scan output 506A, 506B and the data output 510A, 510A of the scan cell 501A, 501B. Furthermore, scan enable 511A, 511B of the scan cell 501A, 501B is coupled to the selector 522A, 522B of the multiplexer 513A, 513B, and the clock input 512A, 512B of the scan cell 501A, 501B is coupled to the clock input 528A, 528B of the D flip-flop 515A, 515B.

For each scan cell 501A the data input 508A is directly coupled to one of the input pins 304A–304D via a bonding connection 414A–414D and for each scan cell 501B the data input 508B is directly coupled to one of the core outputs 414E–414G of the ASIC core logic 402. Furthermore, for each scan cell 501A the data output 510A is directly coupled to one of the core outputs 414A–414D of the ASIC core logic 402, and for each scan cell 501B the data output 510B is directly coupled to one of the output pins 304E–304G via a bonding connection 414E–414G.

The D flip-flop 515A, 515B latches cell data placed on the D input 524A, 524B by the multiplexer 513A, 513B in response to a positive edge of a clock signal received via clock input 512A, 512B. Furthermore, the D flip-flop 515A, 515B outputs the latched cell data to the data output 510A, 510B and the scan output 516A, 516B via the Q output 526A, 526B.

Assuming that input scan cells 400A–400D are each implemented as a scan cell 501A and the output scan cells 400E–400G are each implemented as a scan cell 501B, the external tester 300 may configure the scan cells 400A–400G for a scan mode of operation by driving the scan enable pin 308 to an active state. In the scan mode of operation, the multiplexer 513A, 513B passes the scan input signal on the scan input 504A, 504B to the D input 524A, 524B of the D flip-flop 515A, 515B. As depicted in FIG. 4, each scan input 504A, 504B is coupled to the scan output 506A, 506B of the previous scan cell 400A–400G. Therefore, in the scan mode of operation the data stored in each scan cell 400A–400G is shifted to the next scan cell 400A–400G upon the rising edge of the clock signal.

Furthermore, the external tester 300 may configure scan cells 400A–400G for the normal mode of operation by driving the scan enable pin 308 to an inactive state. In the scan mode of operation, the multiplexer 513A, 513B passes the data input signal on the data input 508A, 508B to the D input 524A, 524B of the D flip-flop 515A, 515B. Therefore, in the normal mode of operation data which is impressed upon the input pins 304A–304D is latched into the input scan cells 400A–400D upon the rising edge of the clock signal assuming the bonding connections 414A–414D are proper. Furthermore, in the normal mode of operation data from the core outputs 414E–414G is impressed upon the output pins 304E–304G upon the rising edge of the clock signal assuming the bonding connections 414E–414G are proper.

Most ASIC's include a D flip-flop that is coupled to each input pin in order to latch and hold the data signal impressed upon the input pins. Likewise, most ASIC's includes a D flip-flop that is coupled to each output pin in order to latch and hold the data signal impressed upon the output pins. Preferably, the scan cells 501A, 501B use the D flip-flop that is already present in most ASIC designs for the D flip-flop 515A, 515B.

It should be appreciated from the above discussion that the scan cell 501A introduces a two-to-one multiplexer signal propagation time delay between the input pins 304A–304D and the ASIC core logic 402. Likewise, the scan cell 501B introduces a two-to-one multiplexer signal propagation time delay between the ASIC core logic 401 and the output pins 304E–304G. This time delay is in addition to the time delay of ASIC core logic 402. In addition to the time delay, scan cells 501A, 501B increase the gate count of ASIC 300. Table 2 gives the equivalent gate count for one scan cell 501A, 501B where the number of equivalent gates is the number of the two input NAND gates required to duplicate the function of the logic section.

TABLE 2

| Gate Type | # Equivalent Gates | # in Cell | Total # Equivalent Gates |
| --- | --- | --- | --- |
| 2 Input Mux | 3 | 1 | 3 |
| D Flip-Flop | 8 | 1 | 8 |
| | Total Equivalent Gates in Cell | | 11 |

However, as stated above, the scan cell 501A, 501B preferably utilizes the existing D flip-flops of the ASIC 300. Thus, the scan cells 501A, 501B only require an additional 6 equivalent gates for each input pin-output pin pair, or in general: Additional SC Gate Count=(# Input Pins)*3 +(# Output Pins)*3. This additional scan cell gate count is considerably less than the additional 44 gate count for each input pin-output pin pair of the prior art. Furthermore, the ASIC 302 need not contain the test logic 120 of the prior art, thus further reducing the physical size and cost of ASIC 302.

As stated in the background, signal propagation delay as signals travel through additional test circuitry may be detrimental to the ASIC performance. This is especially true when ASICs are used in high speed systems where only minimal additional time delays can be tolerated. In order to reduce the signal propagation delay of the ASIC 300, the signal propagation delay of the critical path of the ASIC 302 must be reduced. The critical path is the signal path through the ASIC 302 having the longest propagation delay. Since the signal propagation delay of the ASIC 302 is at least as long as the longest propagation delay through the ASIC 300, any reduction in the signal propagation delay of the critical path of the ASIC 302 may reduce the propagation delay of the ASIC 302 and increase the speed at which the ASIC 302 may operate.

Figure 6A:
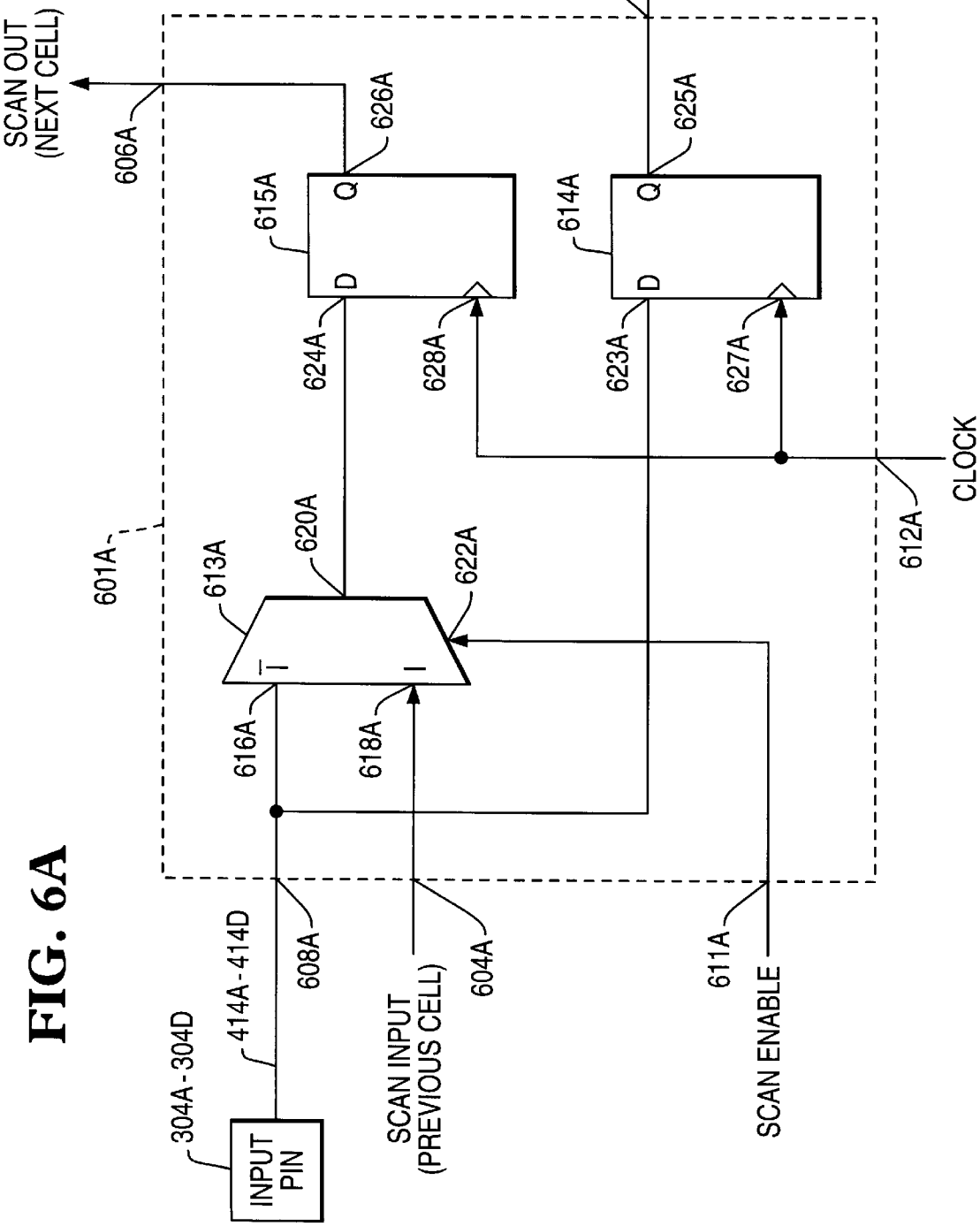
FIG. 6A shows a second embodiment for an input scan cell of FIG. 4.
Figure 6B:
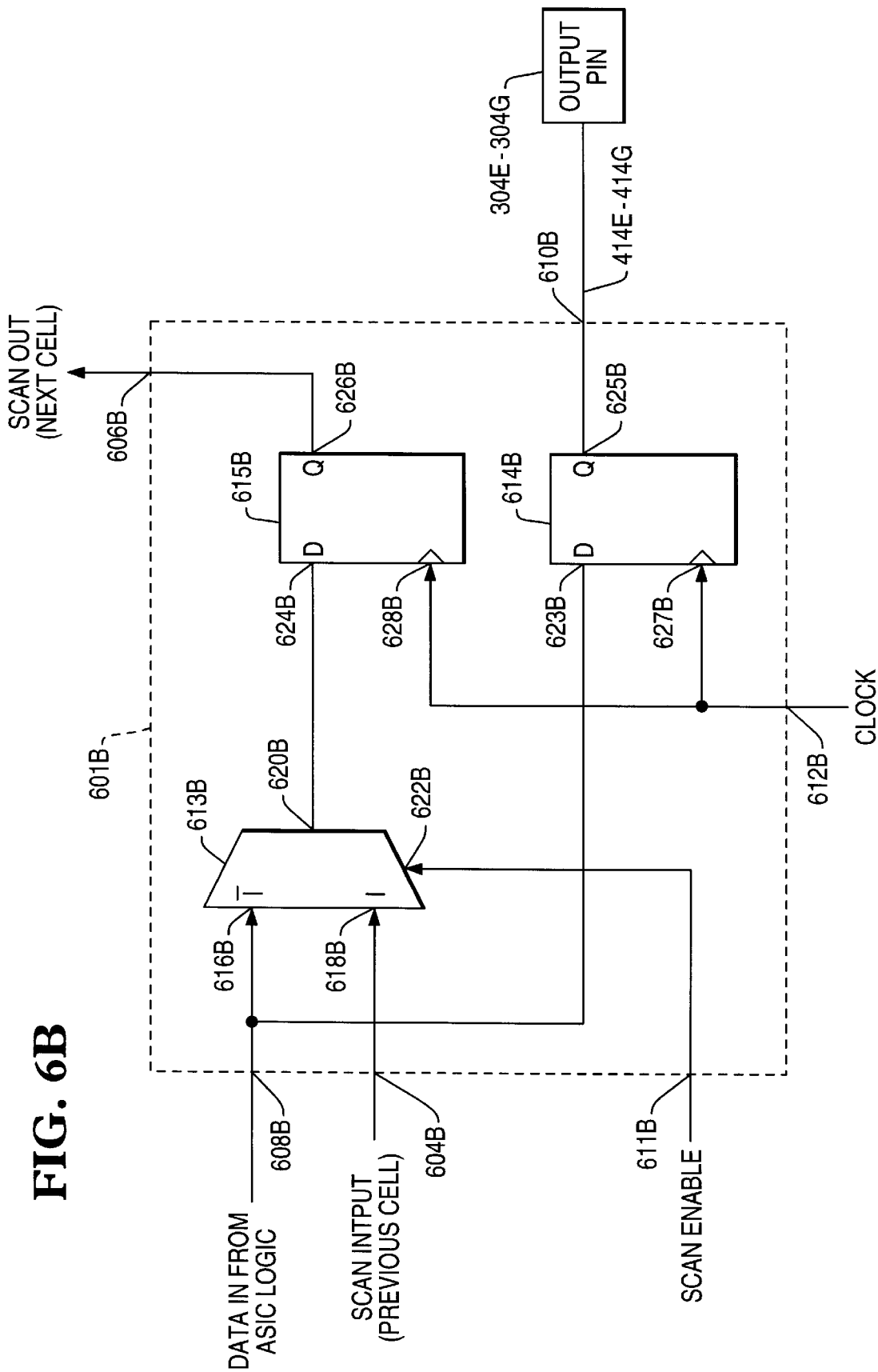
FIG. 6B shows a second embodiment for an output scan cell of FIG. 4.

A second embodiment 601A for input scan cells 400A–400D and a second embodiment 601B for output scan cells 400E–400G are shown in FIGS. 6A and 6B. The scan cell embodiments 601A, 601B are preferably used for scan cells 400A–400G coupled to I/O pins 304A–304E that are to be latched and that are in the critical path of the ASIC 300. Furthermore, the basic structure of the scan cells 601A, 601B is the same. The only difference between the scan cells 601A, 601B is the source of the input signal for the cell and the use of the output signal from the cell.

Each scan cell 601A, 601B includes a scan input 604A, 604B, a scan output 606A, 606B, a data input 608A, 608B, a data output 610A, 610B, a scan enable 611A, 611B, a clock input 612A, 612B, a two-to-one multiplexer 613A, 613B, a first D-type flip-flop 614A, 614B, and a second D-type flip-flop 615A, 615B. The multiplexer 613A, 613B includes a first input 616A, 616B, a second input 618A, 618B, an output 620A, 620B, and a selector 622A, 622B. The first D flip-flop 614A, 614B includes a D input 623A, 623B, a Q output 625A, 625B, and a positive edge triggered clock input 627A, 627B. The second D flip-flop 615A, 615B includes a D input 624A, 624B, a Q output 626A, 626B, and a positive edge triggered clock input 628A, 628B.

The first input 616A, 616B of the multiplexer 613A, 613B is directly coupled to the data input 608A, 608B of the scan cell 601A, 601B, and the second input 618A, 618B of the multiplexer 613A, 613B is coupled to the scan input 604A, 604B of the scan cell 601A, 601B. The output 620A, 620B of the multiplexer 613A, 613B is directly coupled to the D input 624A, 624B of the second D flip-flop 615A, 615B, and the selector 622A, 622B of the multiplexer 613A, 613B is coupled to the scan enable 611A, 611B of the scan cell 601A, 601B. The D input 623A. 623B of the first D flip-flop 614A, 614B is directly coupled to the data input 608A, 608B of the scan cell 601A, 601B, and the Q output 625A. 625B of the first D flip-flop 614A, 614B is directly coupled to the data output 610A, 610B of the scan cell 601A, 601B. Furthermore, the Q output 626A, 626B of the second D flip flop 615A, 615B is coupled to the scan output 606A, 606B of the scan cell 601A, 601B and the clock input 612A, 612B of the scan cell 601A, 601B is coupled to both the clock input 627A, 627B of the first D flip-flop 614A, 614B and the clock input 628A, 628B of the second D flip-flop 615A, 615B.

For each scan cell 601A the data input 608A is directly coupled to one of the input pins 304A–304D via a bonding connection 414A–414D and for each scan cell 601B the data input 608B is directly coupled to one of the core outputs 414E–414G of the ASIC core logic 402. Furthermore, for each scan cell 601A the data output 610A is directly coupled to one of the core outputs 414A–414D of the ASIC core logic 402, and for each scan cell 601B the data output 610B is directly coupled to one of the output pins 304E–304G via a bonding connection 414E–414G.

In response to a positive edge of a clock signal received via clock input 612A, 612A, 612B, the first D flip-flop 615A, 615B of the scan cell 601A, 601B latches cell data on the data input 608A, 608B and outputs the latched cell data to the data output 610A, 610B. Likewise, in response to a positive edge of a clock signal received via clock input 612A, 612B, the second D flip-flop 615A, 615B latches cell data placed on the D input 624A, 624B by the multiplexer 613A, 613B and outputs the latched cell data to the scan output 616A, 616B.

Assuming that the input scan cells 400A–400D are each implemented as a scan cell 601A and the output scan cells 400E–400G are each implemented as a scan cell 601B, the external tester 300 may configure scan cells 400A–400G for a scan mode of operation by driving the scan enable pin 308 to an active state. In the scan mode of operation, the multiplexer 613A, 613B passes the scan input signal on the scan input 604A, 604B to the D input 624A, 624B of the D flip-flop 615A, 615B. As depicted in FIG. 4, each scan input 604A, 604B is coupled to the scan output 606A, 606B of the previous scan cell 400A–400G. Therefore, in the scan mode of operation the data stored in each scan cell 400A–400G is shifted to the next scan cell 400A–400G upon the rising edge of the clock signal.

Furthermore, the external tester 300 may configure scan cells 400A–400G for the normal mode of operation by driving the scan enable pin 308 to an inactive state. In the normal mode of operation, the data input signal on the data input 608A, 608B is passed directly to the D input 623A, 623B of the first D flip-flop 614A, 614B. Therefore, in the normal mode of operation, data which is impressed upon the input pins 304A–304D is latched into the input scan cells 400A–400D upon the rising edge of the clock signal assuming the bonding connections 414A–414D are proper. Furthermore, in the normal mode of operation, data from the core outputs 414E–414G is impressed upon the output pins 304E–304G upon the rising edge of the clock signal assuming the bonding connections 414E–414G are proper.

As stated above, most ASIC's include a D flip-flop that is coupled to each input pin in order to latch and hold the data signal impressed upon the input pins. Likewise, most ASIC's includes a D flip-flop that is coupled to each output pin in order to latch and hold the data signal impressed upon the output pins. Preferably, the scan cells 601A, 601B use the D flip-flop that is already present in most ASIC designs for the D flip-flop 615A, 615B.

It should be appreciated from the above discussion that the scan cell 601A introduces no additional logic-induced delay between the input pins 304A–304D and the ASIC core logic 402. Likewise, the scan cell 601B introduces no additional logic-induced delay between the ASIC core logic 401 and the output pins 304E–304G. The scan cells 601A, 601B, however, increase the gate count of ASIC 300. Table 3 gives the equivalent gate count for one scan cell 601A, 601B.

TABLE 3

| Gate Type | # Equivalent Gates | # in Cell | Total # Equivalent Gates |
|---|---|---|---|
| 2 Input Mux | 3 | 1 | 3 |
| D Flip-Flop | 8 | 2 | 16 |
| | Total Equivalent Gates in Cell | | 19 |

However, as stated above, the scan cell 601A, 601B preferably utilizes the existing D flip-flops of the ASIC 302 for the second D flip-flops 615A, 615B. Thus, the scan cells 601A, 601B only require an additional 22 equivalent gates for each input pin-output pin pair, or in general: Additional SC Gate Count=(# Input Pins)*11+(# Output Pins)*11. This additional scan cell gate count is considerably less than the additional 44 gate count for each input pin-output pin pair of the prior art. Furthermore, the ASIC 302 need not contain the additional test logic 120 logic of the prior art, thus further reducing the physical size and cost of ASIC 302.

Figure 7A:
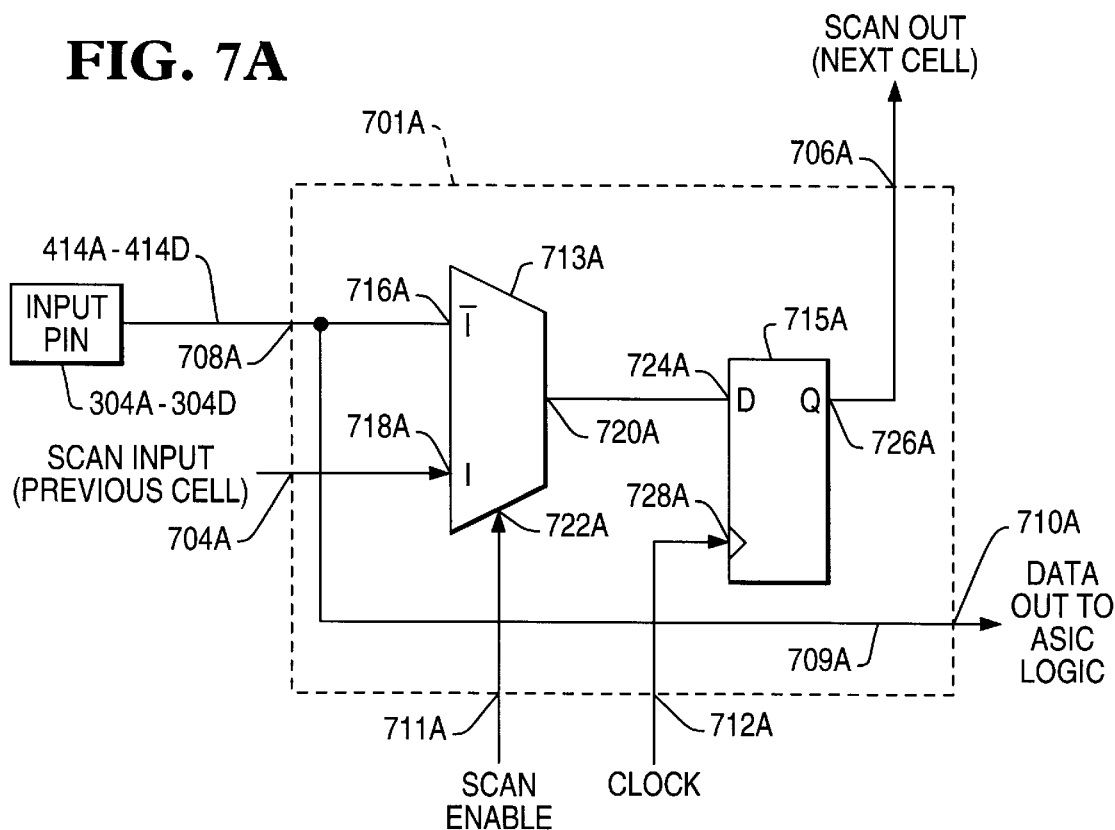
FIG. 7A shows a third embodiment for an input scan cell of FIG. 4.
Figure 7B:
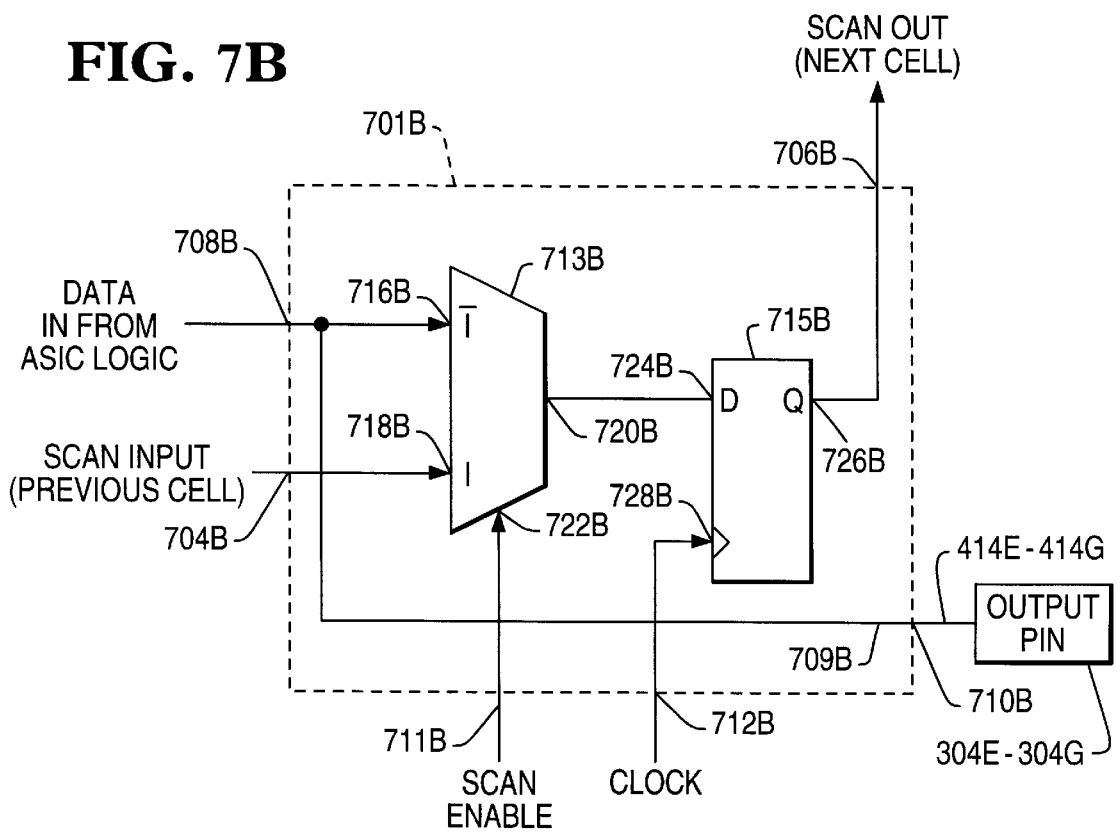
FIG. 7B shows a third embodiment for an output scan cell of FIG. 4.

A third embodiment 701A for input scan cells 400A–400D and a third embodiment 601B for output scan cells 400E–400G are shown in FIGS. 7A and 7B. The scan cell embodiments 701A, 701B are preferably used for scan cells 400A–400G coupled to I/O pins 304A–304E that are in the critical path of the ASIC 302 but do not need to be latched. Furthermore, the basic structure of the scan cells 701A, 701B is the same. The only difference between the scan cells 701A, 701B is the source of the input signal for the cell and the use of the output signal from the cell.

Each scan cell 701A, 701B includes a scan input 704A, 704B, a scan output 706A, 706B, a data input 708A, 708B, a data output 710A, 710B, a scan enable 711A, 711B, a clock input 712A, 712B, a two-to-one multiplexer 713A, 713B, and a D-type flip-flop 715A, 715B. The multiplexer 713A, 713B includes a first input 716A, 716B, a second input 718A, 718B, an output 720A, 720B, and a selector 722A, 722B. The D flip-flop 715A, 715B includes a D input 724A, 724B, a Q output 726A, 726B, and a positive edge triggered clock input 728A, 728B.

The data input 708A, 708B of the scan cell 701A, 701B is directly coupled directly to the data output 710A, 710B of the scan cell 701A, 701B via by-pass line 709A, 709B. The first input 716A, 716B of the multiplexer 713A, 713B is directly coupled to the data input 708A, 708B of the scan cell 701A, 701B, and the second input 718A, 718B of the multiplexer 713A, 713B is coupled to the scan input 704A, 704B of the scan cell 701A, 701B. The output 720A, 720B of the multiplexer 713A, 713B is directly coupled to the D input 724A, 724B of the D flip-flop 715A, 715B, and the selector 722A, 722B of the multiplexer 713A, 713B is coupled to the scan enable 711A, 711B of the scan cell 701A, 701B. Furthermore, the 0 output 726A, 726B of the D flip flop 715A, 715B is coupled to the scan output 706A, 706B of the scan cell 701A, 701B and the clock input 712A, 712B of the scan cell 701A, 701B is coupled to the clock input 728A, 728B of the D flip-flop 715A, 715B.

For each scan cell 701A, the data input 708A is directly coupled to one of the input pins 304A–304D via a bonding connection 414A–414D and for each scan cell 701B, the data input 708B is directly coupled to one of the core outputs 414E–414G of the ASIC core logic 402. Furthermore, for each scan cell 701A, the data output 710A is directly coupled to one of the core outputs 414A–414D of the ASIC core logic 402, and for each scan cell 701B, the data output 710B is directly coupled to one of the output pins 304E–304G via a bonding connection 414E–414G.

Since the data input 708A, 708B of the scan cell 701A, 701B is directly coupled to the data output 710A, 710B of the scan cell 701A, 701B, data that is impressed upon the data input 708A, 708B is directly impressed upon the data output 710A, 710B without a significant delay. Furthermore, in response to a positive edge of a clock signal received via clock input 712A, 712B, the D flip-flop 715A, 715B latches cell data placed on the D input 724A, 724B by the multiplexer 713A, 713B and outputs the latched cell data to the scan output 716A, 716B.

Assuming that the input scan cells 400A–400D are each implemented as a scan cell 701A and that the output scan cells 400E–400G are each implemented as a scan cell 701B, the external tester 300 may configure scan cells 400A–400G for a scan mode of operation by driving the scan enable pin 308 to an active state. In the scan mode of operation, the multiplexer 713A, 713B passes the scan input signal on the scan input 704A, 704B to the D input 724A, 724B of the D flip-flop 715A, 715B. As depicted in FIG. 4, each scan input 704A, 704B is coupled to the scan output 706A, 706B of the previous scan cell 400A–400G. Therefore, in the scan mode of operation the data stored in each scan cell 400A–400G is shifted to the next scan cell 400A–400G upon the rising edge of the clock signal.

Furthermore, the external tester 300 may configure scan cells 400A–400G for the normal mode of operation by driving the scan enable pin 308 to an inactive state. In the normal mode of operation, the data input signal on the data input 708A, 708B is passed directly to the data output 710A, 710B. Therefore, in the normal mode of operation, data which is impressed upon the input pins 304A–304D is directly impressed upon the core inputs 414A–414D assuming the bonding connections 414A–414D are proper. Furthermore, in the normal mode of operation, data from the core outputs 414E–414G is directly impressed upon the output pins 304E–304G assuming the bonding connections 414E–414G are proper.

It should be appreciated from the above discussion that the scan cell 701A introduces no additional delay between the input pins 304A–304D and the ASIC core logic 402. Likewise, the scan cell 701B introduces no additional delay between the ASIC core logic 401 and the output pins 304E–304G. The scan cells 701A, 701B, however, increase the gate count of ASIC 300. Table 4 gives the equivalent gate count for one scan cell 701A, 701B.

TABLE 4

| Gate Type | # Equivalent Gates | # in Cell | Total # Equivalent Gates |
|---|---|---|---|
| 2 Input Mux | 3 | 1 | 3 |
| D Flip-Flop | 8 | 1 | 8 |
| | Total Euivalent Gates in Cell | | 11 |

As shown in Table 4, the scan cells 701A, 701B only require an additional 22 equivalent gates for each input pin-output pin pair, or in general: Additional SC Gate Count=(# Input Pins)*11+(# Output Pins)*11. This additional scan cell gate count is considerably less than the additional 44 gate count for each input pin-output pin pair of the prior art. Furthermore, the ASIC 302 need not contain the additional registers and control logic of the prior art, thus further reducing the physical size and cost of ASIC 302.

It should be appreciated that the above embodiments 501A, 501 B, 601A, 601B, 701A, and 701B may be mixed and matched within a single ASIC 300. In other words, there is no requirement that all of the scan cells 400A–400B be implemented the same.

ASIC pin fault testing of the present invention is preferably accomplished via separate tests or separate parts of a single test. A first test is for testing the input pins 304A–304D and a second test is used for testing the output pins 304E–304G. The present invention may be used to attempt to detect three types of continuity or connectivity problems. In particular, the present invention may detect (1) pins that are stuck at a logic "0", or (2) pins that are stuck at a logic "1".

An input pin "stuck" at a logic "0" means that the ASIC core logic 402 receives a logic "0" for the input pin regardless of the logic value impressed upon the input pin. Likewise, an input pin "stuck" at a logic "1" means that the ASIC core logic 402 receives a logic "1" for the input pin regardless of the logic value impressed upon the input pin. Similarly, an output pin "stuck" at a logic "0" means that the output pin outputs a logic "0" regardless of the logic value that ASIC core logic 402 attempts to impress upon the output pin. Likewise, an output pin "stuck" at a logic "1" means that the output pin outputs a logic "1" regardless of the logic value that the ASIC core logic 402 attempts to impress upon the output pin.

The present invention may test for input pins or output pins that are stuck at a logic "0" by utilizing a test pattern of all logic "1"s. If the outputted continuity pattern is all logic "1"s, no input pin or no output terminal is stuck at a logic "0". Similarly, the present invention may test for input pins or output pins that are stuck at a logic "1" by utilizing a test pattern of all logic "0"s. Furthermore, the present invention may do more exhaustive tests that combine the above test patterns with patterns of alternating logic "1"s and "0"s.

Figure 8:
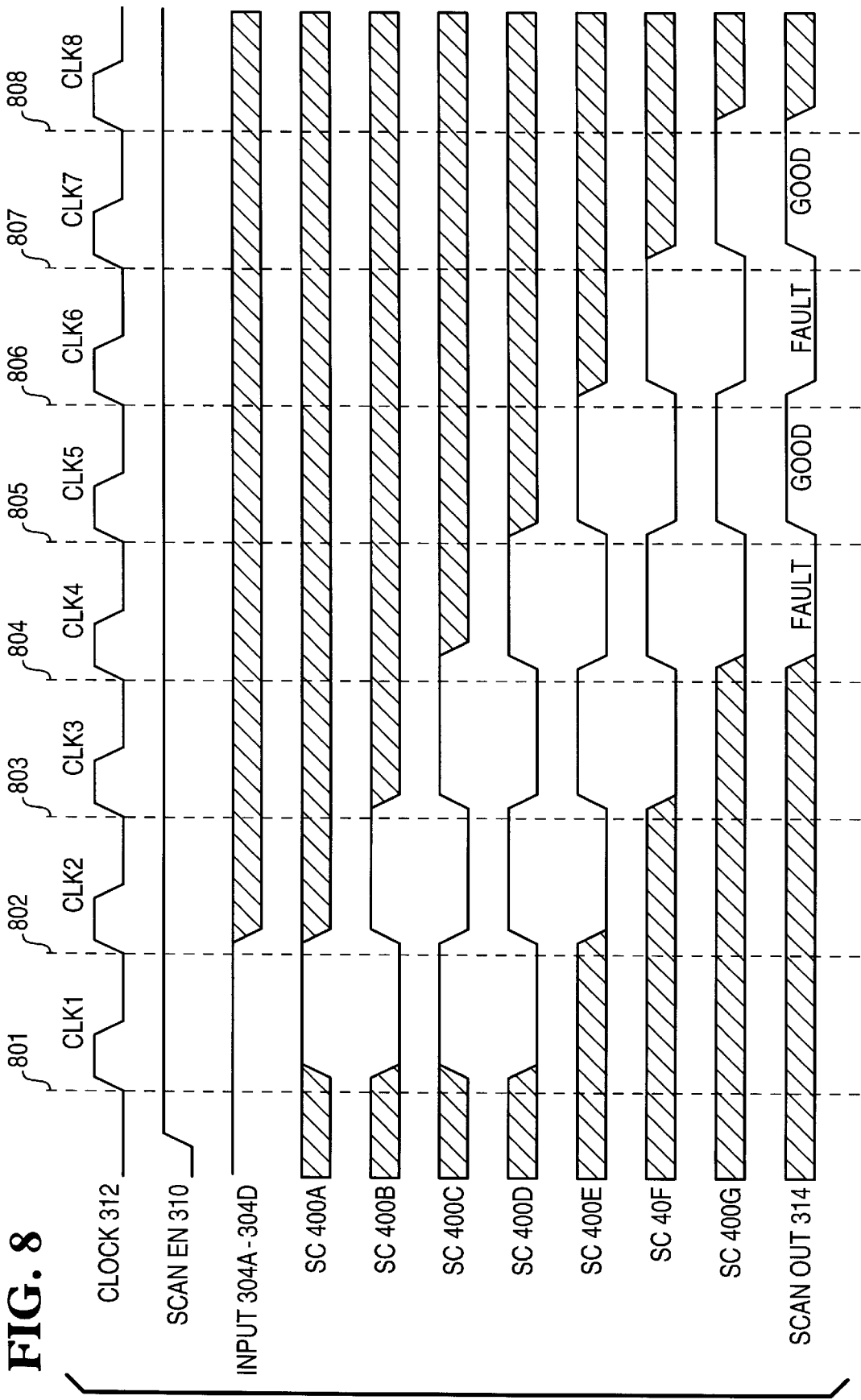
FIG. 8 shows a timing diagram depicting a method of testing the ASIC of FIG. 3 for ASIC input pin faults.

In order to illustrate how the external tester 300 may utilize the I/O scan structure of ASIC 302 to test input pins 304A–304D for pin faults, reference will now be made to FIG. 8. The external tester 300 impresses a steady clock signal upon the ASIC clock pin 312 via ASIC clock line 332; however, an oscillator circuit could alternatively drive the ASIC clock pin 312 and a clock input of the external tester 300. Prior to clock edge 801, the external tester 300 places the scan enable pin 310 into a low state by forcing the scan enable line 330 to a low voltage. The forcing of the scan enable pin 310 into a low state configures the scan cells 400A–400G into the normal mode of operation. As stated above, in the normal mode of operation, data upon the data inputs 408A–408G of the scan cells 400A–400F is latched and passed through to the data outputs 410A–410G the scan cells 400A–400G. Furthermore, prior to the clock edge 801, the external tester 300 places test data upon the input pins 304A–304D by impressing voltages upon the input lines 324A–324D. As depicting in FIG. 8, the tester 300 places a logic "1" upon each input pin 304A–304D by impressing a high voltage upon each input line 324A–324D.

Shortly after the clock edge 801, each of the input scan cells 400A–400D stores pin continuity data that is upon its cell input 414A–414D. The continuity data upon each cell input 414A–414D is indicative of the one bit of test data upon its respective input pin 304A–304D if its respective bonding connection 414A–414D properly couples the input pin 304A–304D to its respective data input 408A–408D. As depicted in FIG. 8, bonding connections 414B and 414D do not properly couple the input pins 304B and 304D to their respective data inputs 408B and 408D since a logic "0" which was stored in each input scan cell 400B and 400D upon clock edge 801 is not indicative of the logic "1" which was placed upon each input pin 304B and 304D.

Then, prior to clock edge 802, the external tester 300 places the scan enable pin 310 into a high state by forcing the scan enable line 330 to a high voltage. The forcing of the scan enable pin 310 into a high state configures the scan cells 400A–400G for the scan mode of operation. As stated above, when the scan cells 400A–400G are placed in the scan mode of operation, data which is stored in the scan cells 400A–400G is serially shifted through the scan cells 400A–400G upon each rising edge of the clock signal.

Shortly after the clock edge 802, the continuity data which is stored in the input scan cells 400A–400D is shifted to scan cells 400B–400E. In particular, the continuity data that was stored in scan cell 400D is shifted to scan cell 400E, the continuity data that was stored in scan cell 400C is shifted to scan cell 400D, the continuity data that was stored in scan cell 400B is shifted to scan cell 400C, and the continuity data that was stored in scan cell 400A is shifted to scan cell 400B. Therefore, as shown in FIG. 8, a logic "1" is stored in each scan cell 400B and 400D, and a logic "0" is stored in each scan cell 400C and 400E.

For clock cycle CLK3, the external tester 300 continues to assert the scan enable line 330. In other words, prior to the clock edge 803, the external tester 300 continues to impress a voltage upon the scan enable pin 310 which places the scan cells 400A–400G into the scan mode of operation and holds this impressed voltage for a sufficient time after the clock edge 803. As depicted in FIG. 8, the external tester 300 continues to impress a high voltage upon the scan enable pin 310. Since the external tester 300 continues to assert the scan enable line 330, the continuity data which is stored in the scan cells 400B–400E is shifted to scan cells 400C–400F shortly after the clock edge 803. Therefore, a logic "1" is stored in each scan cell 400C and 400E, and a logic "0" is stored in each scan cell 400D and 400F.

The external tester 300 continues to assert the scan enable line 330 for clock cycle CLK4. Since the external tester 300 continues to assert the scan enable line 330, the continuity data which is stored in the input scan cells 400C–400F is shifted to scan cells 400D–400G shortly after the clock edge 804. Therefore, a logic "1" is stored in each scan cell 400D and 400F, and a logic "0" is stored in each scan cell 400E and 400G. Furthermore, in response to storing data in scan cell 400G, the data which is stored in scan cell 400G is placed upon the scan-out pin 314. The data stored in scan cell 400G corresponds to the continuity data that was generated from the test data impressed upon input pin 304D. Therefore, the external tester 300 can obtain the continuity data for input pin 304D from the scan-out pin 314.

Once the external tester 300 obtains the continuity data for input pin 304D, the external tester 300 may determine whether the bonding connection 410D is faulty by comparing the continuity data for input pin 304D to the test data that was impressed upon input pin 304D just prior to clock cycle CLK1. Since, the impressed test data for input pin 304D was a logic "1" and the continuity data for is a logic "0," the external tester 300 may generate a signal or a report that indicates that the bonding connection 410D may be faulty.

The external tester 300 continues to assert the scan enable line 330 for clock cycle CLK5. Since the external tester 300 continues to assert the scan enable line 330, the continuity data which is stored in the input scan cells 400D–400F is shifted to scan cells 400E–400G shortly after the clock edge 805. Therefore, a logic "1" is stored in scan cell 400F, and a logic "0" is stored in each of the scan cells 400E and 400G. Furthermore, in response to storing data in scan cell 400G, the data which is stored in scan cell 400G is placed upon the scan-out pin 314. The data stored in scan cell 400G corresponds to the continuity data that was generated from the test data impressed upon input pin 304C. Therefore, the external tester 300 can obtain the continuity data for input pin 304C from the scan-out pin 314.

Once the external tester 300 obtains the continuity data for input pin 304C, the external tester 300 may determine whether the bonding connection 410C is faulty by comparing the continuity data for input pin 304C to the test data that was impressed upon input pin 304C just prior to clock cycle CLK1. Since, the impressed test data for input pin 304C was a logic "1" and the continuity data for is a logic "1," the external tester 300 may generate a signal or a report that indicates that the bonding connection 410C and input pin 304C passed this test. In other words, it is still possible that the input pin 304C is stuck high even though this particular test has not detected a fault.

The external tester 300 continues to assert the scan enable line 330 for clock cycle CLK6. Since the external tester 300 continues to assert the scan enable line 330, the continuity data which is stored in the input scan cells 400E–400F is shifted to scan cells 400F–400G shortly after the clock edge 806. Therefore, a logic "1" is stored in the scan cell 400G, and a logic "0" is stored in the scan cell 400F. Furthermore, in response to storing data in scan cell 400G, the data which is stored in scan cell 400G is placed upon the scan-out pin 314. The data stored in scan cell 400G corresponds to the continuity data that was generated from the test data impressed upon input pin 304B. Therefore, the external tester 300 can obtain the continuity data for input pin 304B from the scan-out pin 314.

Once the external tester 300 obtains the continuity data for input pin 304B, the external tester 300 may determine whether the bonding connection 410B is faulty by comparing the continuity data for input pin 304B to the test data that was impressed upon input pin 304B just prior to clock cycle CLK1. Since, the impressed test data for input pin 304B was a logic "1" and the continuity data for is a logic "0," the external tester 300 may generate a signal or a report that indicates that the bonding connection 410D may be faulty.

The external tester 300 continues to assert the scan enable line 330 for clock cycle CLK7. Since the external tester 300 continues to assert the scan enable line 330, the continuity data which is stored in the scan cell 400F is shifted to scan cell 400G shortly after the clock edge 806. Therefore, a logic "0" is stored in the scan cell 400G. Furthermore, in response to storing data in scan cell 400G, the data which is stored in scan cell 400G is placed upon the scan-out pin 314 via scan line 406H. The data stored in scan cell 400G corresponds to the continuity data that was generated from the test data impressed upon input pin 304A. Therefore, the external tester 300 can obtain the continuity data for input pin 304A from the scan-out pin 314.

Once the external tester 300 obtains the continuity data for input pin 304A, the external tester 300 may determine whether the bonding connection 410A is faulty by comparing the continuity data for input pin 304A to the test data that was impressed upon input pin 304A just prior to clock cycle CLK1. Since, the impressed test data for input pin 304A was a logic "1" and the continuity data for input pin 304A is a logic "1," the external tester 300 may generate a signal or a report that indicates that the bonding connection 410A and input pin 304A passed this test. As stated above, it is still possible that the input pin 304A is stuck high even though this particular test has not detected a fault. Furthermore, it should be appreciated that the input pins 304A–304D could be further tested with test data of logic "0's" in order to determine whether the input pins 304A–304D are stuck high.

Figure 9:
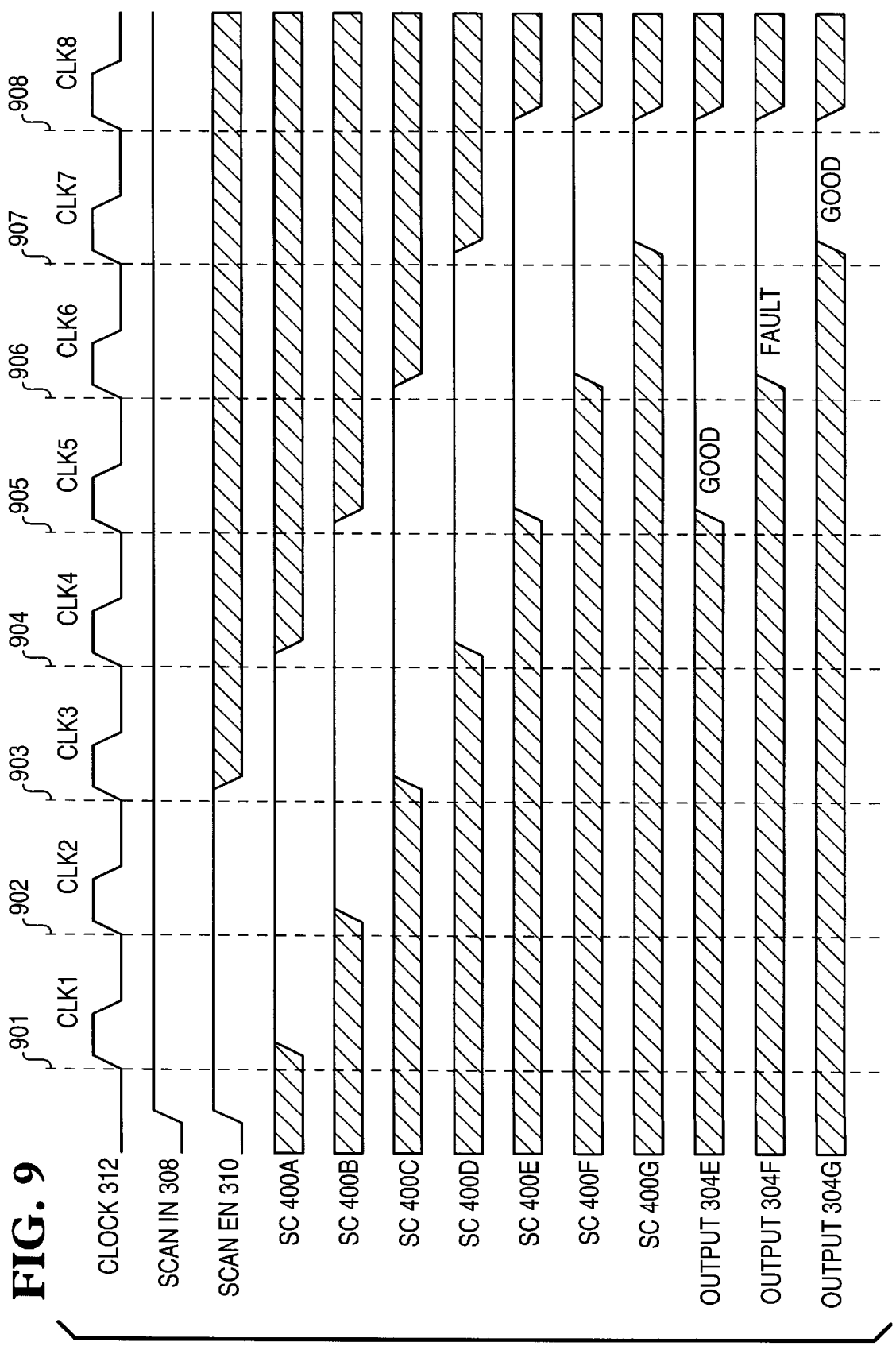
FIG. 9 shows a timing diagram depicting a method of testing the ASIC of FIG. 3 for ASIC output pin faults.

In order to illustrate how the external tester 300 may utilize the I/O scan structure of ASIC 302 to test output pins 304E–304G for pin faults, reference will now be made to FIG. 9. Sometime prior to clock cycle CLK1, the external tester 300 asserts the scan enable line 330 thereby forcing the scan enable pin 310 into a high state. As stated above, the forcing of the scan enable pin 310 into a high state configures the scan cells 400A–400G into the scan mode of operation. Furthermore, sometime prior to clock cycle CLK1, the external tester 300 places a first bit of test data upon the scan-in pin 308 by impressing a voltage upon the scan-in line 328. As depicting in FIG. 9, the external tester 300 places a logic "1" upon the scan-in pin 308 by impressing a high voltage upon the scan-in line 318. Shortly after the clock edge 901, the scan cell 400A stores the first bit of test data that is upon the scan-in pin 308.

For clock cycle CLK2, the external tester 300 places a second bit (a logic "1") of test data upon the scan-in pin 308 and continues to assert the scan enable line 330. Since the external tester 300 continues to assert the scan enable line 330, the second bit of test data upon the scan-in pin 308 and the first bit of test data in the scan cell 400A are shifted to scan cells 400A and 400B shortly after the clock edge 902. Therefore, a logic "1" is stored in each scan cell 400A–400B.

For clock cycle CLK3, the external tester 300 places a third bit (a logic "1") of test data upon the scan-in pin 308 and continues to assert the scan enable line 330. Since the external tester 300 continues to assert the scan enable line 330, the third bit of test data upon the scan-in pin 308 and the test data stored in the scan cell 400A–400B are shifted to scan cells 400A–400C shortly after the clock edge 903. Therefore, a logic "1" is stored in each scan cell 400A–400C.

For clock cycle CLK4, the external tester 300 continues to assert the scan enable line 330. As a result, the test data stored in the scan cells 400A–400C are shifted to scan cells 400B–400D shortly after the clock edge 904. Therefore, a logic "1" is stored in each scan cell 400B–400D.

For clock cycle CLK5, the external tester 300 continues to assert the scan enable line 330. As a result, the test data stored in the scan cells 400B–400D is shifted to scan cells 400C–400E shortly after the clock edge 905. Therefore, a logic "1" is now stored in each scan cell 400C–400E.

For clock cycle CLK6, the external tester 300 continues to assert the scan enable line 330. As a result, the test data stored in the scan cells 400C–400E is shifted to scan cells 400D–400F shortly after the clock edge 906. Therefore, a logic "1" is now stored in each scan cell 400D–400F.

For clock cycle CLK7, the external tester 300 continues to assert the scan enable line 330. As a result, the test data stored in the scan cells 400D–400F is shifted to scan cells 400E–400G shortly after the clock edge 907. At this point, each output scan cell 400E–400G contains a test bit of the test data and is attempting to impress its test bit its respective output pin 304E–304G via bonding connections 414E–414G. This attempt to impress a test bit generates continuity data upon each output pin 304E–304G. The continuity data upon each output pin 304E–304G is indicative of the test bit upon its respective data output 410E–410G if its respective bonding connection 414E–414G properly couples its data output 410E–410G to its respective output pin 304E–304G.

Therefore, the external tester 300 can obtain continuity data for the output pins 304E–304G by reading from the output pins 304E–304G during the clock cycle CLK7. Once the external tester 300 obtains the continuity data for the output pins 304E–304G, the external tester 300 may determine whether any of the bonding connections 414E–414G are faulty by comparing each bit of the continuity data to each bit of the test data that was scanned into the ASIC 302 during clock cycles CLK1, CLK2, and CLK3. Since all the bits of the test data were a logic "1" and the continuity data for output pin 304F is a logic "0," the external tester 300 may generate a signal or a report that indicates that the bonding connection 414F may be faulty. Furthermore, since all the bits of the test data were a logic "1" and the continuity data for the output pins 304E and 304G or a logic "1's", the external tester 300 may generate a signal or a report that indicates that the bonding connections 414E, 414G and output pins 304E, 304G passed this test. In other words, it is still possible that the output pins 304E, 304G are stuck high even though this particular test has not detected a fault. Furthermore, it should be appreciated that the output pins 304E–304G could be further tested with test data of logic "0's" in order to determine whether the output pins 304E–304G are stuck high While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. An integrated circuit, comprising:

a logic core having a first core input;

a scan enable pin for receiving a control signal;

a scan-in pin for receiving scan data;

a first input pin for receiving first data;

a scan-out pin for outputting said scan data;

a first mulitplexer having (1) a first mux input coupled to said scan-in pin, (2) a second mux input directly coupled to said first input pin via a first bonding connection, (3) a first mux select coupled to said scan enable pin, and (4) a first mux output upon which said first multiplexer places first cell data that is selected from (i) a first bit of said scan data upon said first mux input, and (ii) a first bit of continuity data upon said second mux input, wherein (1) said first cell data is selected based on said control signal, and (2) said first bit of said continuity data is indicative of said first data if continuity exists between said first input pin and said second mux input; and a first storage element having (1) a first storage input directly coupled to said first mux output, and (2) a first storage output directly coupled to said first core input and further coupled to said scan-out pin, wherein said first storage element is configured to latch said first cell data placed on said first mux output.

2. The circuit of claim 1, wherein said logic core has a second core input, further comprising:

a second input pin for receiving second data;

a second mulitplexer having (1) a third mux input coupled to said first storage output, (2) a fourth mux input coupled to said second input pin via a second bonding connection, (3) a second mux select coupled to said scan enable pin, and (4) a second mux output upon which said second multiplexer places second cell data that is selected from (i) a second bit of said scan data upon said third select input, and (ii) a second bit of said continuity data upon said fourth select input, wherein (1) said second cell data is selected based on said control signal, and (2) said second bit of said continuity data is indicative of said second data if continuity exists between said second input pin and said fourth mux input; and a second storage element having (1) a second storage input directly coupled to said second mux output, and (2) a second storage output directly coupled to said second core input and further coupled to said scan-out pin, wherein (1) said second storage element is configured to latch said second cell data placed on said second mux output, and (2) said coupling of said first storage element to said scan-out pin is via said second multiplexer and said second storage element.

3. The circuit of claim 1, wherein said logic core has a core output, further comprising:

an output pin for outputting a second bit of said continuity data;

a second multiplexer having (1) a third mux input coupled to said first storage output, (2) a fourth mux input directly coupled to said core output, (3) a second mux select coupled to said scan enable pin, and (4) a second mux output upon which said second multiplexer places second cell data that is selected from (i) a second bit of said scan data upon said third mux input, and (ii) core data upon said fourth mux input, wherein said second cell data is selected based on said control signal; and a second storage element having (1) a second storage input directly coupled to said second mux output, and (2) a second storage output directly coupled to said output pin via a second bonding connection and further coupled to said scan-out pin, wherein (1) said second storage element is configured to latch said second cell data placed on said second mux output and to impress said second bit of said continuity data upon said output pin, and (2) said second bit of said continuity data is indicative of said second cell data if continuity exists between said second storage output and said output pin, and (3) said coupling of said first storage element to said scan-out pin is via said second multiplexer and said second storage element.

4. An integrated circuit, comprising:
   a logic core having a first core output;
   a scan enable pin for receiving a control signal;
   a scan-in pin for receiving scan data;
   an output pin for outputting a first bit of continuity data;
   a first multiplexer having (1) a first mux input coupled to said scan-in pin, (2) a second mux input directly coupled to said core output, (3) a first mux select coupled to said scan enable pin, (4) and a first mux output upon which said first multiplexer places first cell data that is selected from (i) a first bit of said scan data upon said first mux input, and (ii) first core data upon said first core output, wherein said first cell data is selected based on said control signal; and
   a first storage element having (1) a first storage input coupled to said first mux output, and (2) a first storage output directly coupled to said output pin via a first bonding connection, wherein (1) said first storage element is configured to latch said first cell data placed on said first mux output and to impress said first bit of said continuity data upon said output pin, and (2) said first bit of said continuity data is indicative of said first cell data if continuity exists between said first storage output and said output pin.

5. The circuit of claim 4, wherein said logic core has a second core output, further comprising:
   a second output pin for outputting a second bit of said continuity data;
   a second multiplexer having (1) a third mux input coupled to said first storage output, (2) a fourth mux input directly coupled to said second core output, (3) a second mux select coupled to said scan enable pin, and (4) a second mux output upon which said second multiplexer places second cell data that is selected from (i) a second bit of said scan data upon said third mux input, and (ii) second core data upon said fourth mux input, wherein said second cell data is selected based on said control signal; and
   a second storage element having (1) a second storage input coupled to said second mux output, and (2) a second storage output directly coupled to said second output pin via a second bonding connection, wherein (1) said second storage element is configured to latch said second cell data placed on said second mux output and to impress said second bit of said continuity data upon said second output pin, and (2) said second bit of said continuity data is indicative of said second cell data if continuity exists between said second storage output and said output pin.

6. The circuit of claim 4, wherein said logic core has a core input, further comprising:
   a first input pin for receiving first data;
   a second mulitplexer having (1) a third mux input coupled to said scan-in pin, (2) a fourth mux input directly coupled to said first input pin via a second bonding connection, (3) a second mux select that is coupled to said scan enable pin, and (4) a second mux output upon which said second multiplexer places second cell data that is selected from (i) a second bit of said scan data upon said third mux input, and (ii) a second bit of said continuity data upon said fourth mux input, wherein (1) said second cell data is selected based on said control signal, and (2) said second bit of said continuity data is indicative of said first data if continuity exists between said first input pin and said second mux input; and
   a second storage element having (1) a second storage input coupled to said second mux output, and (2) a second storage output directly coupled to said first core input and further coupled to said first mux input, wherein (1) said second storage element is configured to latch said second cell data placed on said second mux output, and (2) said coupling of said first mux input to said scan-in pin is via said second multiplexer and said second storage element.

7. A system for pin fault testing, comprising:
   an integrated circuit including a logic core, a plurality of pins, a first multiplexer, and a first storage element;
   an external tester coupled to said plurality of pins of said integrated circuit, said external tester configured to input test data into said integrated circuit, to receive continuity data from said integrated circuit, and to determine pin faults from a comparison of said test data inputted into said integrated circuit to said continuity data received from said integrated circuit, wherein:
   said logic core includes a first core input,
   said plurality of pins includes (1) a scan enable pin for receiving a control signal, (2) a scan-in pin for receiving scan data, (3) a scan-out pin for outputting said scan data, and (4) a first input pin for receiving first data;
   said first mulitplexer includes (1) a first mux input coupled to said scan-in pin, (2) a second mux input directly coupled to said first input pin via a first bonding connection, (3) a first mux select coupled to said scan enable pin, and (4) a first mux output upon which said first multiplexer places first cell data that is selected from (i) a first bit of said scan data upon said first mux input, and (ii) a first bit of said continuity data upon said second mux input, wherein (1) said first cell data is selected based on said control signal, and (2) said first bit of said continuity data is indicative of said first data if continuity exists between said first input pin and said second mux input; and
   said first storage element includes (1) a first storage input coupled to said first mux output, and (2) a first storage output coupled to said first core input and further coupled to said scan-out pin, wherein said first storage element is configured to latch said first cell data placed on said first mux output.

8. The system of claim 7, wherein said logic core has a second core input, and said integrated circuit further comprises:
   a second input pin for receiving second data;
   a second mulitplexer having (1) a third mux input coupled to said first storage output, (2) a fourth mux input directly coupled to said second input pin via a second bonding connection, (3) a second mux select coupled to said scan enable pin, and (4) a second mux output upon which said second multiplexer places second cell data that is selected from (i) a second bit of said scan data upon said third select input, and (ii) a second bit of said continuity data upon said fourth select input, wherein (1) said second cell data is selected based on said control signal, and (2) said second bit of said continuity data is indicative of said second data if continuity exists between said second input pin and said fourth mux input; and a second storage element having (1) a second storage input directly coupled to said second mux output, and (2) a second storage output directly coupled to said second core input and further coupled to said scan-out pin, wherein (1) said second storage element is configured to latch said second cell data placed on said second mux output, and (2) said coupling of said first storage element to said scan-out pin is via said second multiplexer and said second storage element.

9. The system of claim 7, wherein said logic core has a core output, and said integrated circuit further comprises:

an output pin for outputting second continuity data;

a second multiplexer having (1) a third mux input coupled to said first storage output, (2) a fourth mux input directly coupled to said core output, (3) a second mux select coupled to said scan enable pin, and (4) a second mux output upon which said second multiplexer places second cell data that is selected from (i) a second bit of said scan data upon said third mux input, and (ii) core data upon said fourth mux input, wherein said second cell data is selected base on said control signal; and a second storage element having (1) a second storage input directly coupled to said second mux output, and (2) a second storage output directly coupled to said output pin via a second bonding connection and further coupled to said scan-out pin, wherein (1) said second storage element is configured to latch said second cell data placed on said second mux output and to impress said second bit of said continuity data upon said output pin, (2) said second bit of said continuity data is indicative of said second cell data if continuity exists between said second storage output and said output pin, and (3) said coupling of said first storage element to said scan-out pin is via said second multiplexer and said second storage element.

10. An integrated circuit, comprising (1) a logic core having a first core input; (2) a scan enable pin for receiving a control signal; (3) a scan-in pin for receiving scan data; (4) a first input pin for receiving first data; (5) a scan-out pin for outputting said scan data; and (6) a first scan cell having (i) a first data input directly coupled to said first input pin via a first bonding connection, (ii) a first data output directly coupled to said first core input, (iii) a first scan input coupled to said scan-in pin, (iv) a first scan output coupled to said scan-out pin, and (v) a first scan enable coupled to said scan enable pin, wherein said first scan cell includes:

a first mulitplexer having (1) a first mux input coupled to said first scan input, (2) a second mux input directly coupled to said first data input, (3) a first mux select coupled to said first scan enable, and (4) a first mux output upon which said first multiplexer places first cell data that is selected from (i) a first bit of said scan data upon said first mux input, and (ii) a first bit of continuity data upon said second mux input, wherein (1) said first cell data is selected based on said control signal, and (2) said first bit of said continuity data is indicative of said first data if continuity exists between said first input pin and said second mux input; and a first storage element having (1) a first storage input directly coupled to said first mux output, and (2) a first storage output directly coupled to said first data output and further coupled to said scan output, wherein said first storage element is configured to latch said first cell data placed on said first mux output.

11. The circuit of claim 10, wherein said logic core has a second core input, further comprising:

a second input pin for receiving second data; and a second scan cell having (1) a second data input directly coupled to said second input pin via a second bonding connection, (2) a first data output directly coupled to said second core input, (3) a second scan input coupled to said first scan output of said first scan cell, (4) a second scan output coupled to said scan-out pin, and (5) a second scan enable coupled to said scan enable pin, wherein (1) said second scan cell latches second cell data that is selected from (i) a second bit of said scan data from said first scan cell that is on said second scan input, and (ii) a second bit of said continuity data that is on said second data input, (2) said second cell data is selected based on said control signal, (3) said second bit of said continuity data is indicative of said second data if continuity exists between said second input pin and said second data input, and (4) said coupling of said first scan output to said scan-out pin is via said second scan cell.

12. The circuit of claim 10, wherein said logic core has a core output, further comprising:

an output pin for outputting a second bit of said continuity data; and a second scan cell having (1) a second data input directly coupled to said core output, (2) a first data output directly coupled to said output pin via a second bonding connection, (3) a second scan input coupled to said first scan output of said first scan cell, (4) a second scan output coupled to said scan-out pin, and (5) a second scan enable coupled to said scan enable pin, wherein (1) said second scan cell latches second cell data that is selected from (i) a second bit of said scan data from said first scan cell that is on said second scan input, and (ii) core data from said core output that is on said second data input, (2) said second scan cell impresses said second bit of said continuity data on said output pin, (3) said second cell data is selected based on said control signal, (4) said second bit of said continuity data is indicative of said second cell data if continuity exists between said second data output and said output pin, and (5) said coupling of said first scan output to said scan-out pin is via said second scan cell.

13. An integrated circuit, comprising (1) a logic core having a first core input; (2) a scan enable pin for receiving a control signal; (3) a scan-in pin for receiving scan data; (4) a first input pin for receiving first data; (5) a scan-out pin for outputting said scan data; and (6) a first scan cell having (i) a first data input directly coupled to said first input pin via a first bonding connection, (ii) a first data output directly coupled to said first core input, (iii) a first scan input coupled to said scan-in pin, (iv) a first scan output coupled to said scan-out pin, and (v) a first scan enable coupled to said scan enable pin, wherein said first scan cell includes:

a first mulitplexer having (1) a first mux input coupled to said first scan input, (2) a second mux input directly coupled to said first data input, (3) a first mux select coupled to said first scan enable, and (4) a first mux output upon which said first multiplexer places first cell data that is selected from (i) a first bit of said scan data upon said first mux input, and (ii) a first bit of continuity data upon said second mux input, wherein (1) said first cell data is selected based on said control signal, (2) said first bit of said continuity data is indicative of said first data if continuity exists between said first input pin and said second mux input;

a first storage element having (1) a first storage input directly coupled to said first mux output, and (2) a first storage output directly coupled to said first scan output, wherein said first storage element is configured to latch said first cell data placed on said first mux output; and a second storage element having (1) a second storage input directly coupled to said first data input, and (2) a second storage output directly coupled to said first data output, wherein said second storage element is configured to latch said first data.

14. The circuit of claim 13, wherein said logic core has a second core input, further comprising:

a second input pin for receiving second data; and a second scan cell having (1) a second data input directly coupled to said second input pin via a second bonding connection, (2) a first data output directly coupled to said second core input, (3) a second scan input coupled to said first scan output of said first scan cell, (4) a second scan output coupled to said scan-out pin, and (4) a second scan enable coupled to said scan enable pin, wherein (1) said second scan cell latches second cell data that is selected from (i) a second bit of said scan data from said first scan cell that is on said second scan input, and (ii) a second bit of said continuity data that is on said second data input, (2) said second cell data is selected based on said control signal, (3) said second bit of said continuity data is indicative of said second data if continuity exists between said second input pin and said second data input, and (4) said coupling of said first scan output to said scan-out pin is via said second scan cell.

15. The circuit of claim 13, wherein said logic core has a core output, further comprising:

an output pin for outputting second continuity data; and a second scan cell having (1) a second data input directly coupled to said core output, (2) a first data output directly coupled to said output pin via a second bonding connection, (3) a second scan input coupled to said first scan output of said first scan cell, (4) a second scan output coupled to said scan-out pin, and (5) a second scan enable coupled to said scan enable pin, wherein (1) said second scan cell latches second cell data that is selected from (i) a second bit of said scan data from said first scan cell that is on said second scan input, and (ii) core data from said core output that is on said second data input, (2) said second scan cell impresses said second bit of said continuity data on said output pin, (3) said second cell data is selected based on said control signal, (4) said second bit of said continuity data is indicative of said second cell data if continuity exists between said second data output and said output pin, and (5) said coupling of said first scan output to said scan-out pin is via said second scan cell.

16. An integrated circuit, comprising (1) a logic core having a first core input; (2) a scan enable pin for receiving a control signal; (3) a scan-in pin for receiving scan data; (4) a first input pin for receiving first data; (5) a scan-out pin for outputting said scan data; and (6) a first scan cell having (i) a first data input directly coupled to said first input pin via a first bonding connection, (ii) a first data output directly coupled to said first core input, (iii) a first scan input coupled to said scan-in pin, (iv) a first scan output coupled to said scan-out pin, and (v) a first scan enable coupled to said scan enable pin, wherein said first scan cell includes:

a first mulitplexer having (1) a first mux input coupled to said first scan input, (2) a second mux input directly coupled to said first data input, (3) a first mux select coupled to said first scan enable, and (4) a first mux output upon which said first multiplexer places first cell data that is selected from (i) a first bit of said scan data upon said first mux input, and (ii) a first bit of continuity data upon said second mux input, wherein (1) said first cell data is selected based on said control signal, and (2) said first bit of said continuity data is indicative of said first data if continuity exists between said first input pin and said second mux input;

a first storage element having (1) a first storage input directly coupled to said first mux output, and (2) a first storage output directly coupled to said first scan output, wherein said first storage element is configured to latch said first cell data placed on said first mux output; and a by-pass line which directly couples said first data input to said first data output.

17. The circuit of claim 16, wherein said logic core has a second core input, further comprising:

a second input pin for receiving second data; and a second scan cell having (1) a second data input directly coupled to said second input pin via a second bonding connection, (2) a first data output directly coupled to said second core input, (3) a second scan input coupled to said first scan output of said first scan cell, (4) a second scan output coupled to said scan-out pin, and (5) a second scan enable coupled to said scan enable pin, wherein (1) said second scan cell latches second cell data that is selected from (i) a second bit of said scan data from said first scan cell that is on said second scan input, and (ii) a second bit of said continuity data that is on said second data input, (2) said second cell data is selected based on said control signal, (3) said second bit of said continuity data is indicative of said second data if continuity exists between said second input pin and said second data input, and (4) said coupling of said first scan output to said scan-out pin is via said second scan cell.

18. The circuit of claim 16, wherein said logic core has a core output, further comprising:

an output pin for outputting a second bit of said continuity data; and a second scan cell having (1) a second data input directly coupled to said core output, (2) a first data output directly coupled to said output pin via a second bonding connection, (3) a second scan input coupled to said first scan output of said first scan cell, (4) a second scan output coupled to said scan-out pin, and (5) a second scan enable coupled to said scan enable pin, wherein (1) said second scan cell latches second cell data that is selected from (i) a second bit of said scan data from said first scan cell that is on said second scan input, and (ii) core data from said core output that is on said second data input, (2) said second scan cell impresses said second bit of said continuity data on said output pin, (3) said second cell data is selected based on said control signal, (4) said second bit of said continuity data is indicative of said second cell data if continuity exists between said second data output and said output pin, and (5) said coupling of said first scan output to said scan-out pin is via said second scan cell.

* * * * *